(12) United States Patent
Wang et al.

(10) Patent No.: US 9,249,013 B2
(45) Date of Patent: Feb. 2, 2016

(54) SILICON HARDMASK LAYER FOR DIRECTED SELF-ASSEMBLY

(71) Applicant: Brewer Science Inc., Rolla, MO (US)

(72) Inventors: Yubao Wang, Rolla, MO (US); Mary Ann Hockey, Rolla, MO (US); Douglas J. Guerrero, Rolla, MO (US); Vandana Krishnamurthy, Rolla, MO (US); Robert C. Cox, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 13/862,720

(22) Filed: Apr. 15, 2013

(65) Prior Publication Data

US 2013/0273330 A1    Oct. 17, 2013

Related U.S. Application Data

(60) Provisional application No. 61/624,805, filed on Apr. 16, 2012.

(51) Int. Cl.
```
G03F 7/26      (2006.01)
B81C 1/00      (2006.01)
B81B 1/00      (2006.01)
H01L 21/02     (2006.01)
H01L 21/033    (2006.01)
H01L 21/311    (2006.01)
```

(52) U.S. Cl.
CPC ............... B81C 1/0038 (2013.01); B81B 1/00 (2013.01); B81C 1/00031 (2013.01); G03F 7/26 (2013.01); H01L 21/02126 (2013.01); H01L 21/02282 (2013.01); H01L 21/0332 (2013.01); H01L 21/0337 (2013.01); H01L 21/31144 (2013.01); *B81C 2201/0149* (2013.01); *Y10T 428/24612* (2015.01); *Y10T 428/24802* (2015.01)

(58) Field of Classification Search
CPC .. G03F 7/26; H01L 21/02126; H01L 21/0332
USPC .................................................. 430/311, 313
See application file for complete search history.

(56) References Cited

U.S. PATENT DOCUMENTS

| 7,521,094 | B1 | 4/2009 | Cheng et al. |
| 2004/0245518 | A1 | 12/2004 | Ramanath et al. |

(Continued)

FOREIGN PATENT DOCUMENTS

| EP | 2 832 807 | 2/2015 |
| WO | 2008/070278 | 6/2008 |

OTHER PUBLICATIONS

Han et al., "Cross-Linked Random Copolymer Mats as Ultrathin Nonpreferential Layers for Block Copolymer Self-Assembly," Langmuir, 2010, 26(2), 1311-1315.

(Continued)

*Primary Examiner* — Kathleen Duda
(74) *Attorney, Agent, or Firm* — Hovey Williams LLP

(57) ABSTRACT

Compositions for directed self-assembly patterning techniques are provided which avoid the need for separate anti-reflective coatings and brush neutral layers in the process. Methods for directed self-assembly are also provided in which a self-assembling material, such as a directed self-assembly block copolymer, can be applied directly to the silicon hardmask neutral layer and then self-assembled to form the desired pattern. Directed self-assembly patterned structures are also disclosed herein.

23 Claims, 13 Drawing Sheets

(56) References Cited

U.S. PATENT DOCUMENTS

| | | | |
|---|---|---|---|
| 2004/0256662 | A1 | 12/2004 | Black et al. |
| 2008/0182402 | A1* | 7/2008 | Li et al. .......... 438/618 |
| 2008/0251284 | A1 | 10/2008 | Colburn et al. |
| 2009/0297784 | A1 | 12/2009 | Xu et al. |
| 2010/0294740 | A1* | 11/2010 | Cheng et al. .......... 216/18 |
| 2011/0008956 | A1 | 1/2011 | Lee et al. |
| 2011/0159209 | A1 | 6/2011 | Kawamura et al. |
| 2011/0241175 | A1* | 10/2011 | Koh et al. .......... 257/618 |
| 2011/0275019 | A1* | 11/2011 | Yoon et al. .......... 430/323 |
| 2011/0281085 | A1 | 11/2011 | Tada et al. |
| 2012/0034419 | A1 | 2/2012 | Washburn et al. |
| 2012/0067843 | A1 | 3/2012 | Watanabe et al. |
| 2012/0329273 | A1* | 12/2012 | Bruce et al. .......... 438/653 |

OTHER PUBLICATIONS

Rincon Delgadillo et al., "All track directed self-assembly of block copolymers: process flow and origin of defects," Proc. of SPIE, v. 8323, 83230D-1-83230D-9, 2012.

Rathsack et al., "Pattern Scaling with Directed Self Assembly Through Lithography and Etch Process Integration," Proc. of SPIE, v. 8323, 83230B-1-83230B-14, 2012.

Tiron et al., "Pattern density multiplication by direct self assembly of block copolymers: Towards 300mm CMOS requirements," Proc. of SPIE, v. 8323, 832300-1-832300-7, 2012.

Yi et al., "Contact Hole Patterning for Random Logic Circuits using Block Copolymer Directed Self-Assembly," Proc. of SPIE, 2012, v. 8323, 83230W-1-83230W-6.

Tiron et al., "Self-Assembly Patterning: Towards 300mm CMOS Requirements," Litho Extension Symposium, Miami, USA, Oct. 20, 2011.

Liu et al., "Fabrication of Lithographically Defined Chemically Patterned Polymer Brushes and Mats," Macromolecules, 44 (7), 1876-1885, 2011.

Trombly et al., "Self-Assembly of Diblock Copolymer on Substrates Modified by Random Copolymer Brushes," Macromolecules, 44 (24), 9867-9881, 2011.

Hinsberg, Bill, "Introduction to / Status of Directed Self-Assembly," DSA Workshop, Kobe, Japan, 2010 IBM Corporation.

Welander et al., "Rapid Directed Assembly of Block Copolymer Films at Elevated Temperatures," Macromolecules 41 (8), 2759-2761, 2008.

Ryu et al., "A Generalized Approach to the Modification of Solid Surfaces," Science, v. 308, 236-239, 2005.

Herr, D., "Directed block copolymer self-assembly for nanoelectronics fabrication," J. Mater. Res., 26 (2), Jan. 28, 2011, 122-139.

Cheng et al., "Dense Self-Assembly on Sparse Chemical Patterns: Rectifying and Multiplying Lithographic Patterns Using Block Copolymers," Advanced Materials, 20, 3155-3158, 2008.

Ruiz et al., "Density Multiplication and Improved Lithography by Directed Block Copolymer Assembly," Science, 321, 936-939, 2008.

Wuister et al., "Lithography assisted self-assembly of contact holes on 300-mm wafer scale," J. Micro/Nanolith. MEMS MOEMS, 11(3), 031304-1-031304-9 (Jul.-Sep. 2012).

International Search Report and Written Opinion dated Jul. 25, 2013 in corresponding PCT/US2013/036548 filed Apr. 15, 2013.

Guerrero et al., "Multifunctional hardmask neutral layer for directed self-assembly (DSA) patterning," Proc. of SPIE, vol. 8680, Apr. 11, 2013.

* cited by examiner

SILICON HARDMASK LAYER FOR DIRECTED SELF-ASSEMBLY

CROSS-REFERENCE TO RELATED APPLICATIONS

The present application claims the priority benefit of U.S. Provisional Patent Application Ser. No. 61/624,805, filed Apr. 16, 2012, entitled SILICON HARDMASK LAYER FOR DIRECTED SELF ASSEMBLY, incorporated by reference in its entirety herein.

BACKGROUND

1. Field of the Invention

The present disclosure relates to new methods of directed self-assembly pattern formation in the fabrication of microelectronic structures and hardmask neutral layers for use in the same.

2. Description of Related Art

Currently, the genuine resolution limit for single patterning optical lithography techniques, using 193-nm immersion scanners is 37 nm for dense lines and spaces. However, a relatively new non-lithography patterning technique, called directed self-assembly (DSA), is already capable of forming patterns that are <15 nm. DSA harnesses the ability of some molecules to rearrange themselves into ordered, nanometer-scale structures. Such self-assembling molecules tend to form highly regular and extended arrays of alternating lines or tiled configurations of close-packed circles. Block copolymers containing at least two different components are suggested DSA materials which can be aligned using annealing. In general, self-assembly is based upon the affinity or preference of one of the blocks for the underlying surface and/or air interface. This typically results in parallel lamellar layers. Pre-patterning techniques, such as chemoepitaxy or graphoepitaxy, can be used along with DSA, to de-randomize the alternating patterns formed by annealing blocked copolymer layers, making this technology even more useful in IC manufacturing. In graphoepitaxy, topography on the wafer surface, such as photoresist lines/trenches, is used to guide the self-assembly process. Thus, DSA may be particularly useful for line/space frequency multiplication techniques. In chemoepitaxy, local variations in the surface energy of the layer to which the DSA material is applied dictate how the block copolymers will align. Due to the flexibility of this approach, DSA is quickly becoming a front running technology for forming patterns of <20 nm for integrated circuit (IC) manufacture, and these types of non-lithography techniques will become more and more important in the future.

However, current DSA process flows require the use of several layers, which can complicate the process. In particular, DSA of block copolymers typically requires an organic, neutral "brush" layer applied in the stack underneath the block copolymer layer to induce pattern formation in a manner perpendicular to the substrate surface. For a typical PS-b-PMMA block copolymer, this brush layer usually consists of a random copolymer of styrene and methyl methacrylate (PS-r-PMMA) that has been cured over a long period of time. The brush layer is typically applied over a stack already containing spin-on carbon, a hardmask layer, and a bottom anti-reflective coating (for lithography-assisted DSA techniques). The block copolymer DSA formulations are then coated to a thickness of around 200-400 Å on top of the brush layer and annealed. The annealing process causes the block co-polymer to arrange itself into alternating organized structures.

A conventional DSA process is depicted in FIG. 1. As noted above, a bottom anti-reflective coating is often used in the stack to control reflection during lithography pre-patterning. This pre-pattern is often formed by standard photolithography techniques, such as the patterning of a photoresist. Inorganic layers are also included in the process flow to facilitate the pattern transfer process (e.g., a CVD hard mask). Each of these layers increases the level of complexity in the process and the challenges for chemical matching between layers. The multiple layer process also increases the length of time and cost of the DSA flow.

Thus, there remains a need in the art for improved compositions and methods for DSA patterning of microelectronic substrates.

SUMMARY

The present disclosure is broadly concerned with a method of forming a microelectronic structure using directed self-assembly. The method comprises providing a wafer stack comprising a substrate having a surface; one or more optional intermediate layers on the substrate surface; and a hardmask layer adjacent the intermediate layers if present, or on the substrate surface if no intermediate layers are present. A self-assembling composition is applied directly on top of the hardmask layer, and allowed to self-assemble into a self-assembled layer directly adjacent the hardmask layer. The self-assembled layer comprises a first self-assembled region and a second self-assembled region different from the first self-assembled region.

A microelectronic structure is also disclosed herein. The structure comprises a substrate having a surface; one or more optional intermediate layers on the substrate surface; a hardmask layer adjacent the intermediate layers if present, or on the substrate surface if no intermediate layers are present; and a self-assembled layer formed directly on top of the hardmask layer. The self-assembled layer comprises a first self-assembled region and a second self-assembled region different from the first self-assembled region.

BRIEF DESCRIPTION OF THE DRAWINGS (FIG.) 1 is a schematic illustration of a conventional DSA process;

FIGS. 2(A)-(C) are schematic drawings depicting a microelectronic structure (not to scale) formed according to the invention;

FIGS. 3(A)-(F) are schematic drawings depicting a microelectronic structure (not to scale) formed according to an embodiment of the invention;

FIGS. 4(A)-(F) are schematic drawings depicting a microelectronic structure (not to scale) formed according to a further embodiment of the invention;

DETAILED DESCRIPTION OF THE PREFERRED EMBODIMENTS

Figure 1:
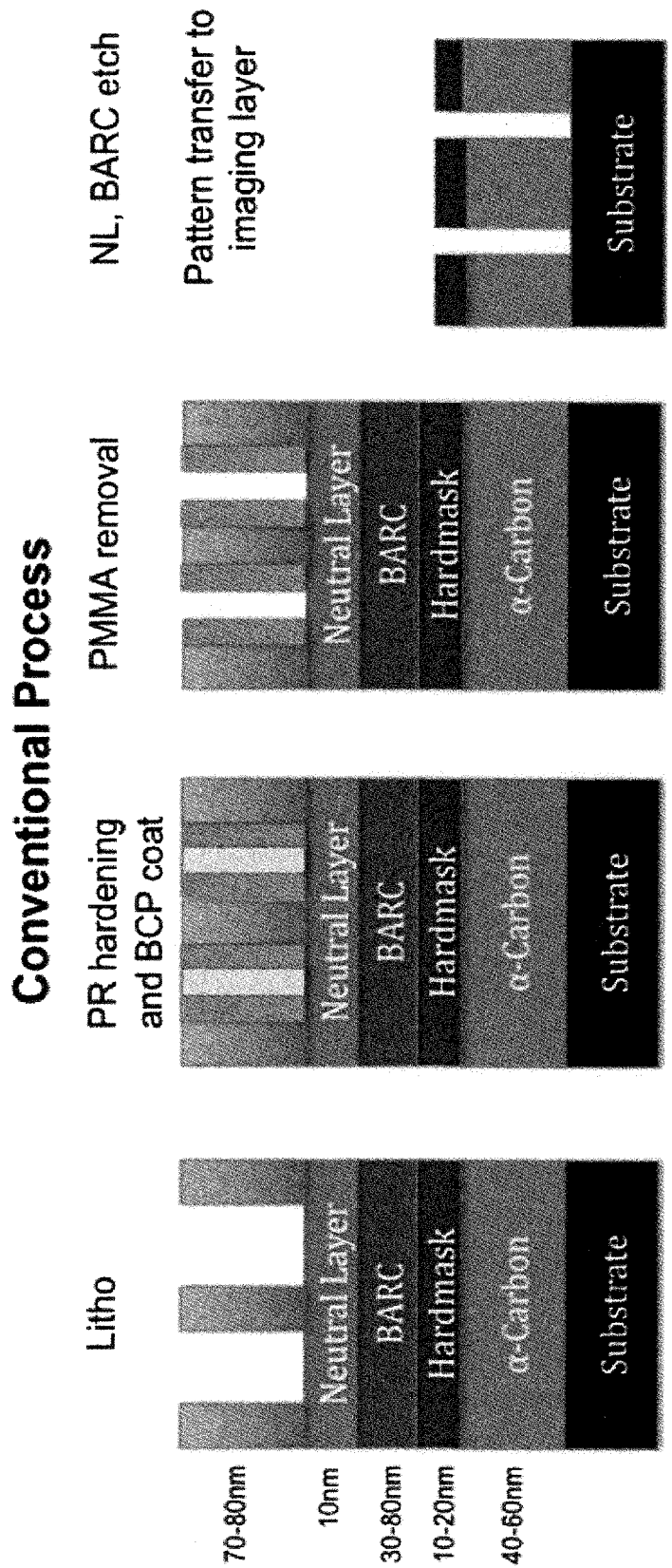
Figure 2:
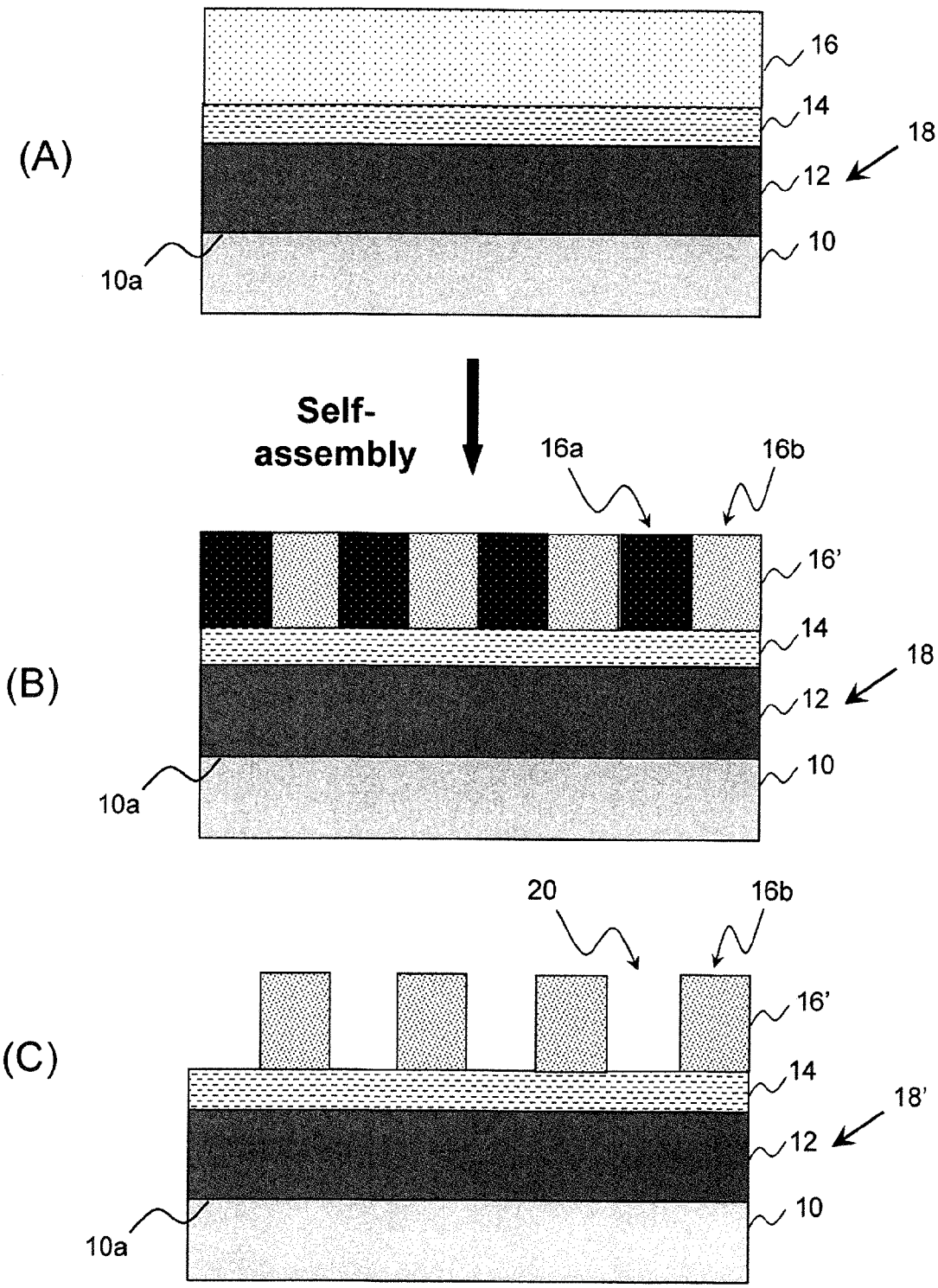

The present disclosure is concerned with new materials for use in the DSA process, along with new methods and structures for DSA patterning. The embodiments eliminate the need for a separate neutral brush layer or anti-reflective coating in the process, and permit the DSA layer to be applied directly on top of the hardmask. The invention also provides new methods of chemoepitaxy and/or graphoepitaxy for facilitating DSA patterning techniques. FIGS. 2(A)-2(C) illustrate the formation of a multi-layer stack and patterning using the inventive hardmask and method. With reference to FIG. 2(A), a substrate 10 having a surface 10a is provided. The substrate 10 can comprise a planar surface, or it can include topography (via holes, contact holes, raised features, etc.). As used herein, "topography" refers to the height or depth of a structure in or on a substrate surface 10a. Any microelectronic substrate 10 can be used in the invention including those selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass phosphorous, or boron-doped glass, alpha-carbon, and mixtures of the foregoing.

An optional intermediate layer 12 can be present or formed on the surface 10a of the substrate 10. The intermediate layer 12 can be formed by any known application method, with one preferred method being spin-coating the composition at speeds of from about 1,000 to about 5,000 rpm (preferably from about from about 1,250 to about 1,750 rpm) for a time period of from about 30 to about 120 seconds (preferably from about 45 to about 75 seconds). Suitable intermediate layers 12 include those selected from the group consisting of spin-on carbon layers, amorphous carbon layers, planarization layers, and combinations of the foregoing. Multiple intermediate layers can also be used (not shown). In one or more embodiments, an intermediate layer 12 is present in the stack and comprises a carbon-rich layer. The term "carbon-rich" refers to layers formed from compositions comprising greater than about 50% by weight carbon, preferably greater than about 70% by weight carbon, and more preferably from about 75 to about 80% by weight carbon, based upon the total solids in the composition taken as 100% by weight. Suitable carbon-rich layers are selected from the group consisting of spin-on carbon layers (SOC), amorphous carbon layers, and carbon planarizing layers. Exemplary carbon-rich layers will be suitable for forming thick layers and preferably have a solids content of from about 0.1% to about 70%, more preferably from about 5% to about 40%, and even more preferably from about 10% to about 30% by weight, based upon the total weight of the composition taken as 100% by weight. After the carbon-rich composition is applied, it s preferably heated to a temperature from about 100° C. to about 300° C., and more preferably from about 160° C. to about 250° C. and for a time period of from about 30 seconds to about 120 seconds, preferably from about 45 seconds to about 60 seconds, to evaporate solvents. The average thickness of the carbon-rich layer 12 after baking can be from about 10 nm to about 50,000 nm, preferably from about 50 nm to about 5,000 nm, more preferably from about 50 nm to about 1,500 nm, and even more preferably from about 50 to about 300 nm.

A hardmask neutral layer 14 is then formed adjacent (i.e., on top of) the uppermost intermediate layer 12, when present, as shown in FIG. 2(A). When no intermediate layer 12 is present, the hardmask neutral layer 14 is formed directly adjacent the substrate surface 10a (not shown). Advantageously, the hardmask layer 14 is formed by spin-coating the hardmask composition at speeds of from about 1,000 to about 5,000 rpm (preferably from about from about 1,250 to about 1,750 rpm) for a time period of from about 30 to about 120 seconds (preferably from about 45 to about 75 seconds). Use of a spin-applied hardmask composition avoids the complications of traditional CVD hardmasks commonly used in DSA techniques. Exemplary hardmask compositions will contain a high silicon content of at least about 10% by weight silicon, preferably from about 20% to about 45% by weight silicon, and more preferably from about 22% to about 38% by weight silicon, based upon the total weight of the cured layer taken as 100% by weight. The hardmask composition will generally comprise a silicon-containing polymer dissolved or dispersed in a solvent system, where the term "polymer" is used herein to encompass both polymers and oligomers having a backbone of linked monomeric repeat units and a weight average molecular weight of from about 800 to about 100,000 Daltons. The silicon-containing polymers comprise repeating units of alternating silicon and oxygen atoms, and are preferably prepared from polymerization of silicon precursor materials such as silanes, siloxanes, and silsesquioxanes. The silicon-containing polymers contain moieties (and preferably pendant moieties) that are compatible with the self-assembling layer, discussed in more detail below. Different combinations of precursors can be used to synthesize copolymers containing at least two different monomeric repeat units in the polymer backbone. It will be appreciated that the precursors having the desired compatible moieties can be selected depending on the particular properties of the self-assembling composition, such that at least one co-monomer in the polymer comprises a moiety compatible with the self-assembling composition.

In one or more embodiments, exemplary precursor materials include those selected from the group consisting of:

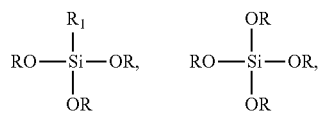

-continued

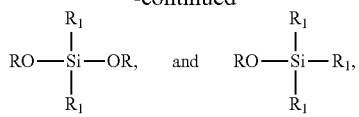

and combinations thereof, where each R is individually selected from the group consisting of —H, alkyls (preferably $C_1$-$C_6$ alkyls, more preferably $C_1$-$C_3$ alkyls), acetate groups, and combinations thereof; and each $R_1$ is individually a compatible moiety. Preferably, at least one of the selected precursor materials has an $R_1$ substituent which is a compatible moiety. The term "compatible moiety," as used herein, refers to a functional group or moiety attached to the polymer (and preferably pendant therefrom) which corresponds to one of the components in the selected self-assembling composition, which is discussed in more detail below. In other words, the compatible moiety is the same, similar, or equivalent to a component in the self-assembling composition in form, function, or characteristic, such that there is an affinity between the compatible moiety and that component. Such affinity induces pattern formation during assembly of the self-assembling composition. Those skilled in the art will appreciate that suitable compatible moieties can be selected based upon the self-assembling material to be used. In one or more embodiments, $R_1$ compatible moieties can be selected from the group consisting of alkyls (preferably $C_1$-$C_{20}$ alkyls, more preferably $C_1$-$C_6$ alkyls), light attenuating moieties, fluorinated hydrocarbons, esters, ethers, and combinations thereof. For example, suitable light attenuating moieties include aromatic groups, such as phenyl, naphthalene, anthracene, and/or carbazole. Such light attenuating moieties can also be used to create high refractive index coatings. In other words, it is envisioned that compatible moieties can be selected to perform multiple functions, including acting as a compatible moiety for directed self-assembly, as well as provide light absorbance. It will also be appreciated that more than one compatible moiety may be used in the hardmask at the same time, and in some embodiments it is preferred that at least two different compatible moieties are included in the hardmask composition.

Certain commercially-available hardmasks may be used in the invention. Other preferred hardmask layers contain a copolymer of monomers selected from the group containing phenethyltrimethoxysilane (PETMS), 2-(carbomethoxy)ethyltrimethoxysilane (CMETMS), tetraethoxysilane (TEOS), methyltrimethoxysilane, and/or phenyltrimethoxysilane.

It will be appreciated that the functionality and function of the silicon-containing polymers (and thus the hardmask layer 14) can be customized by changing the substituents of the polymer (e.g., by changing the compatible moiety as mentioned above). In one or more embodiments, the silicon-containing polymer comprises groups conferring at least two, and more preferably all three of the following attributes to the hardmask layer 14: light absorbance; etch resistance in fluorinated etchants; and/or compatibility (i.e., surface energy) to induce pattern formation. It will further be appreciated that characteristics of the hardmask may need to be modified depending upon the attributes of the DSA material to be used in the process.

In one or more embodiments, the silicone-containing polymers are preferably branched polymers having one or more substituent side chains, and more preferably have 2-D and/or 3-D branching that forms a cage-type structure containing alternating silicon and oxygen atoms defining the cage (i.e., backbone) and appropriate substituents pendant therefrom. In one or more embodiments, the 2-D or 3-D structures comprise recurring units of

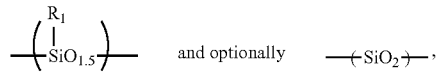

where each $R_1$ is individually a compatible moiety defined above. The silicon-containing polymers typically comprise terminal groups that are either the pendant substituents, or —OH groups. A particularly preferred silicon-containing polymer will comprise the following structural formula:

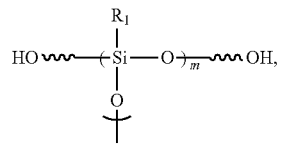

where m denotes a monomeric repeat unit without regard to distribution or position in the backbone (cage), the "squiggly" lines indicate additional polymer backbone structure that may connected the terminal —OH groups (end caps) to the monomeric repeat unit, and each $R_1$ is individually a compatible moiety as defined above. Additives that could be present in the composition include surface energy modifiers, chromophores, flow modifiers, adhesion modifiers, and the like. Such additives can be present as co-monomers in the hardmask polymer, or can simply be physically mixed into the composition.

Suitable solvent systems for use in the hardmask compositions will include a solvent selected from the group consisting of propylene glycol monomethyl ether (PGME), propylene glycol monomethyl ether acetate (PGMEA), gamma-butyrolactone (GBL), cyclohexanone, cyclopentanone, ethyl lactate (EL), ethylacetoacetate (EAA), n-butyl acetate, methyl isobutyl carbinol (MIBC), 2-heptanone, isopropyl alcohol (IPA), methyl ethyl ketone (MEK), and mixtures thereof. Preferably, the solvent system has a boiling point of from about 80 about 210° C., and more preferably from about 90 to about 205° C. The solvent system is preferably utilized at a level of from about 30 to about 99.9% by weight, preferably from about 90 to about 99.5% by weight, and even more preferably from about 98 to about 99% by weight, based upon the total weight of all ingredients in the composition taken as 100% by weight. In one or more embodiments, the hardmask composition will have a solids content of from about 0.1% to about 70%, more preferably from about 0.5% to about 10%, and even more preferably from about 1% to about 2% by weight, based upon the total weight of the composition taken as 100% by weight.

The silicon-containing polymer is dispersed or dissolved in the solvent system, along with the following optional ingredients: surfactants, acid or base catalysts, monomers, polymers, nanoparticles, and/or crosslinkers. Exemplary catalysts include benzyltriethylammonium chloride, ammonium acetate, lithium acetate, tetramethyl ammonium hydroxide, basic salts, and the like. Crosslinkers can be included in the composition; however, the present invention provides a distinct advantage in that the use of crosslinking agents is not necessary. That is, the hardmask provides the necessary curing and/or crosslinking in and of itself to yield a hardmask layer having high crosslinking density. In one or more embodiments, the hardmask composition preferably comprises less than about 3% by weight crosslinking agent, more preferably less than about 1% by weight crosslinking agent, and even more preferably less than about 0.1% by weight crosslinking agent, based upon the total weight of the solids taken as 100% by weight, and even more preferably is essentially free of crosslinking agents. The term "crosslinking agent" is used herein interchangeably with "crosslinker" and includes compounds such as aminoplasts, cresols, epoxies (other than those present on the sol-gel compound itself, when present), polyols, anhydrides, glycidyl ethers, vinyl ethers, melamines, glycolurils, benzoguanamines, and mixtures thereof.

Regardless of the embodiment, after the hardmask is applied, it is preferably heated to a temperature from about 100° C. to about 300° C., and more preferably from about 150° C. to about 250° C. and for a time period of from about 30 seconds to about 120 seconds, preferably from about 45 seconds to about 60 seconds, to evaporate solvents and preferably cure or crosslink the hardmask layer 14. In one or more embodiments, the crosslinked hardmask layer 14 will comprise siloxane crosslinkages. In one or more embodiments, the hardmask compositions are not photosensitive and do not undergo chemical or physical changes upon exposure to light or radiation. For example, in some embodiments, the cured hardmask layer 14 is not developer soluble and cannot be rendered developer-soluble upon exposure to light.

The average thickness (as measured over 5 spots) of the hardmask layer 14 after baking is preferably from about 5 nm to about 50,000 nm, more preferably from about 5 nm to about 1000 nm, and even more preferably from about 10 nm to about 100 nm. The resulting hardmask layer 14 preferably possesses light absorbing properties at a wide range of wavelengths, including wavelengths of less than about 500 nm (e.g., 365 nm, 248 nm, 193 nm, 157 nm, or 13.5 nm). The hardmask layer 14 will preferably have a k value (the imaginary component of the complex index of refraction) of at least about 0.05, preferably from about 0.1 to about 0.3, and more preferably from about 0.15 to about 0.25, and an n value (the real component of the complex index of refraction) of at least about 1.45, preferably from about 1.55 to about 2.25, and more preferably from about 1.65 to about 2. These values can be obtained at a wide range of wavelengths as listed above. The hardmask layer 14 will have a high crosslinking density and high solvent resistance, as discussed in more detail below.

It will be appreciated that formation of the inventive hardmask neutral layer 14 avoids the complications required by conventional CVD hardmask layers, which require special machinery, and subsequently applied brush neutral layers, which require several hours of annealing and a solvent rinse to form a structure suitable for DSA. Thus, the spin-applied hardmask neutral layer provides a significant advantage over the current state of the art.

Advantageously, a self-assembling layer 16 can be applied directly on top of the hardmask layer 14. In other words, there are no intervening layers, such as anti-reflective layers, or brush neutral layers between the two layers, such that the self-assembling layer 16 is in direct contact with at least a portion of the surface of the hardmask layer 14, as depicted in FIG. 2(A). Self-assembling layers 16 can be formed using any suitable material for DSA. In general, such materials contain two or more immiscible compounds (e.g., polymer blends) or a self-assembling compound comprising at least two components having distinct (and often opposite) characteristics, such as functionality, polarity, or water affinity, etch resistance, etc., which allows segregation (essentially nanophase separation) and alignment of the two compounds or components in a rational manner, as well as selective removal of one compound or component. Block copolymers are particularly well-suited to DSA techniques, as they can be synthesized containing at least two distinct blocks allowing for each component to align under appropriate conditions, and be selectively removed after alignment. In one or more embodiments, the self-assembling composition comprises a block copolymer comprising at least one block having a high etch rate in $O_2$ gas, and at least a second block having a low etch rate in $O_2$, gas. Polystyrene-block-poly(methyl methacrylate) copolymers (PS-b-PMMA) are one example of DSA material suitable for use in the invention. These block copolymer molecules generally comprise a string of PS linked to a string of PMMA. Other blocks commonly used in DSA block copolymers include poly(lactic acid) (PLA), poly(ethylene oxide) (PEO), polydimethylsiloxane (PDMS), polyvinylpyrrolidone (PVP; P2VP), and the like. Modified block copolymers can also be used in the invention. For example, individual blocks can be modified to create copolymer blocks. In other words, the individual block itself will comprise a copolymer within that singular block unit, and this copolymer block can be linked to another individual block to create the modified block copolymers. For example, a poly(styrene) block could be modified with vinylbenzocyclobutene to create a block of poly(styrene-co-vinylbenzocyclobutene), which can then be linked to a PMMA block as described above. Such modifications may be made, for example, to increase the crosslinking density of the poly(styrene) block once the layer is annealed, and enhance the different characteristics of the first and second blocks to facilitate selective removal of one block after self-assembly. It will be appreciated that virtually any combination of suitable copolymers or modified copolymers can be used to form block copolymers having functionally distinct blocks for self-assembly. Thus, depending upon the selected DSA material, the hardmask layer 14 and the self-assembling layer 16 can be tuned to one another so that the hardmask compatible moieties induce pattern formation during self-assembly.

Self-assembling compositions will typically comprise the self-assembling compound dispersed or dissolved in a solvent system for casting onto the structure. Suitable solvents include any of the foregoing solvents discussed above for the hardmask layer, as well as PGME, PGMEA, GBL, cyclohexanone, cyclopentanone, EL, EAA, n-butyl acetate, MIBC, 2-heptanone, IPA, MEK, and mixtures thereof. Advantageously, the crosslinked hardmask layer 14 will be substantially insoluble in the solvents used in the DSA layer 16, as well as in common photoresist developers. This allows the self-assembling layer 16 to be formed directly adjacent the hardmask 14 without any intermixing. Thus, when subjected to a stripping test, the crosslinked hardmask layer 14 will have a percent stripping of less than about 5%, preferably less than about 1%, and more preferably about 0%. The stripping test involves first determining the thickness by taking the average of measurements at five different locations of the layer 14. This is the initial average film thickness. Next, the film is rinsed with a solvent or developer for about 30 seconds, followed by spin drying at about 500-3,000 rpm for about 20-60 seconds to remove the solvent. The thickness is measured again at those five points on the wafer using ellipsometry, and the average of these measurements is determined. This is the average final film thickness. The amount of stripping is the difference between the initial and final average film thicknesses. The percent stripping is:

$$\% \text{ stripping} = \left(\frac{\text{amount of stripping}}{\text{initial average film thickness}}\right) \times 100.$$

The self-assembling layer 16 is then allowed to self-assemble, as shown in FIG. 2(B). Self-assembly can be carried out using any suitable technique, including thermal annealing, solvent annealing, microwave annealing, and combinations thereof. In one or more embodiments, the self-assembling layer 16 is subjected to thermal annealing by heating to sufficient temperatures, and preferably above the glass transition temperature (Tg) of the self-assembling compound. In one or more embodiments, the self-assembling layer 16 is heated to a temperature of from about 100° C. to about 350° C. (preferably from about 150° C. to about 250° C.) for time periods of from about 30 seconds to about 10 minutes (preferably from about 1 minute to about 5 minutes). It will be appreciated that the specific annealing conditions will depend on the particular self-assembling material used, and can be varied accordingly.

With reference again to FIG. 2(B), during annealing and self-assembly, the different components of the self-assembling compound segregate according to their distinct characteristics, such that the self-assembled or "annealed" layer 16' is essentially subdivided into at least two different self-assembled or "annealed" regions. In particular, in one or more embodiments, the self-assembled layer 16' comprises first self-assembled or annealed regions 16a and second self-assembled or annealed regions 16b, which are perpendicularly oriented relative to the substrate 10. For example, with respect to PS-b-PMMA block copolymers, during self-assembly, the PMMA sides of each chain are drawn towards each other, while the PS sides of the chains have an affinity for the compatible moieties (i.e., phenyl groups) in the hardmask 14. Depending on the technique used, this can result in the PMMA portions balling together to form cylinders or layers (16a) of PMMA, oriented substantially perpendicular to the substrate, within a matrix of polystyrene (16b). Removing the PMMA (16a) will leave a polystyrene surface (16b) with nanometer-sized holes or trenches. Thus, the first and second self-assembled regions 16a and 16b are compositionally (i.e., chemically, and preferably physically) distinct from one another, and either of the first or second self-assembled regions can then be selectively removed to generate a pattern 20. For example, the first assembled region 16a can have a first etch rate in wet or dry etchants, while the second assembled region 16b has a second etch rate in wet or dry etchants, where in the first and second etch rates are different. In particular, the first etch rate could be faster or slower than the second etch rate depending upon the etchant used. Thus, a suitable etchant can be chosen to selectively removing one of the first or second assembled regions 16a or 16b, while leaving the other of the first or second assembled regions 16a or 16b substantially intact on (or at least not substantially removed from) the hardmask layer 14, yielding the pattern 20.

For example, as shown in FIG. 2(C), the first self-assembled region 16a can be selectively removed to generate a pattern 20 in the self-assembled layer 16' on the patterned stack 18'. The pattern 20 will typically be comprised of features such as trenches, spaces, via holes, and/or contact holes in the annealed self-assembling layer 16'. Advantageously, these features will have an average (mean) respective features size of less than about 30 nm. The term "feature size," as used herein, refers to the average (mean) width of the features as measured on an SEM cross-section of the stack (thus in the case of holes the width is the same as the hole diameter). Various removal techniques can be used, depending on the particular self-assembling compound, such as wet or dry etching. In one or more embodiments, the first self-assembled region 16a can be removed by dry etching (e.g., using $O_2$ plasma). The pattern 20 can then be transferred down into the hardmask layer 14 and carbon-rich layer 12, and ultimately down into the substrate 10 (not shown). In one or more embodiments, the hardmask layer 14 should have a high etch rate in a flourinated gas etchant and a low etch rate in an oxygen gas etchant. For example, the hardmask layer 14 should have an etch rate at least about 0.75 times that of the second self-assembled regions 16b of the self-assembled layer 16' when a fluorine-rich plasma (e.g., $CF_4$) is used as the etchant. The hardmask layer 14 should also have an etch rate at least about 5 times slower than a carbon-rich intermediate layer 12 when an oxygen-rich plasma is used as the etchant.

Figure 3:
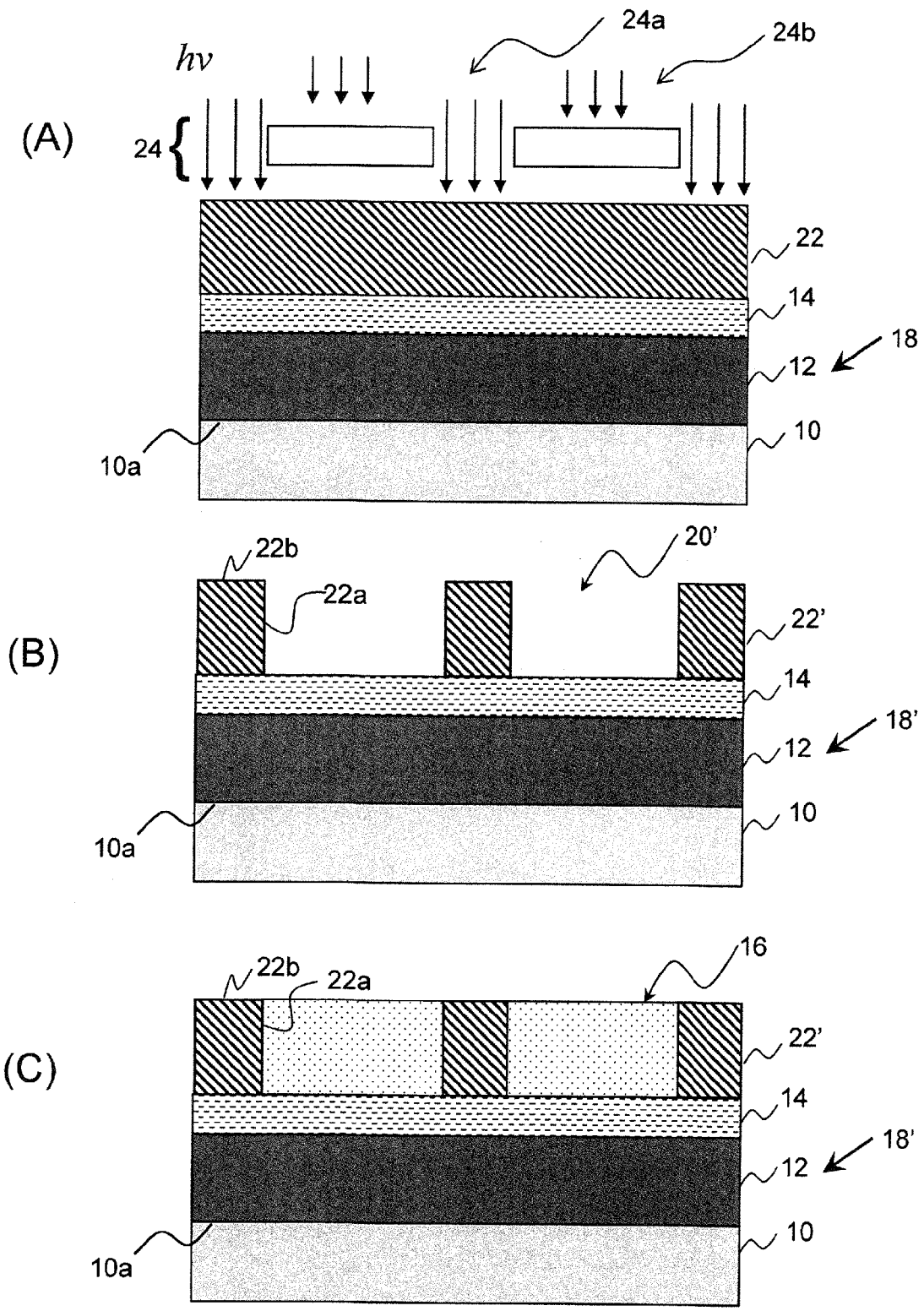
Figure 3:
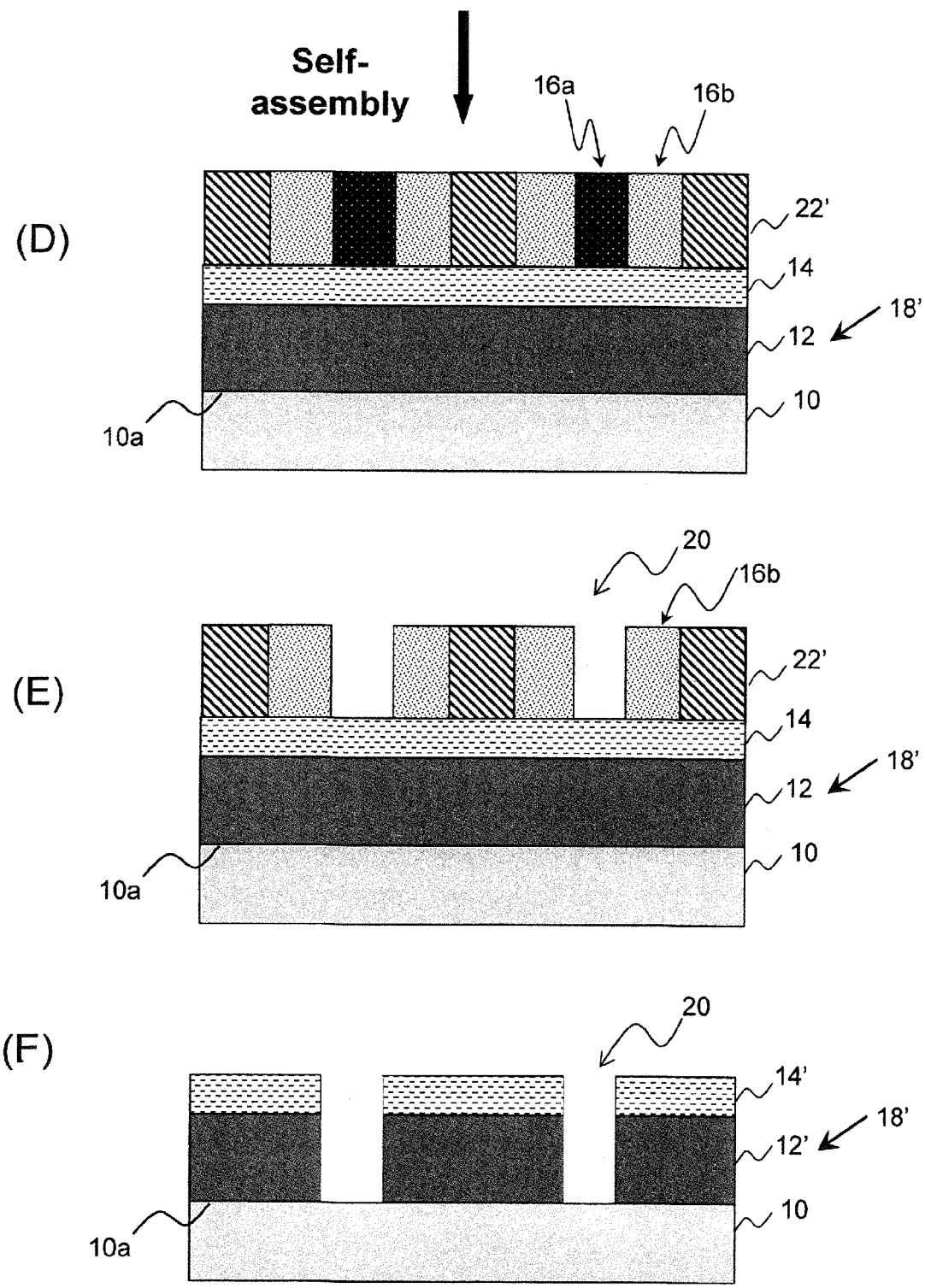

FIG. 3 depicts a further embodiment of the invention using lithography-assisted (e.g., graphoepitaxy) self-assembly. A stack 18 is prepared as described above, using a substrate 10, optional intermediate layer (e.g., carbon-rich layer) 12, and hardmask layer 14. A photosensitive composition can then be applied to the cured hardmask layer 14 to form an imaging layer 22. The resulting stack 18 is illustrated in FIG. 3(A). Suitable photosensitive compositions for use as the imaging layer 22 include any compositions that can be patterned upon exposure to at least about 1 $mJ/cm^2$ radiation, such as photoresists, anti-reflective imaging layers, and the like. The imaging layer 22 can then be post-application baked ("PAB") at a temperature of at least about 80° C., preferably from about 100° C. to about 140° C., and for time periods of from about 10 seconds to about 120 seconds (preferably from about 30 seconds to about 60 seconds). The thickness of the imaging layer 22 is preferably from about 10 nm to about 300 nm, more preferably from about 20 nm to about 150 nm, and even more preferably from about 30 nm to about 100 nm.

As depicted in FIG. 3(A), the imaging layer 22 can then be patterned, for example, by exposure to radiation (e.g., light in the case of optical lithography) of the appropriate wavelength, followed by development of the unexposed portions of the imaging layer 22. In one embodiment, as shown in FIG. 3(A), the imaging layer 22 is exposed using a mask 24 positioned above the imaging layer 22. The mask 24 has open areas 24a designed to permit radiation (hv) to pass through the mask 24 and contact the imaging layer 22 to yield exposed portions of the imaging layer 22 that are rendered insoluble in solvent (when using a negative-tone photoresist). The remaining solid portions 24b of the mask 24 are designed to prevent radiation from contacting the imaging layer 22 in certain areas to yield unexposed portions of the imaging layer that remain solvent soluble. Those skilled in the art will readily understand that the arrangement of open areas 24a and solid portions 24b is designed based upon the desired pattern to be formed in the imaging layer 22, although the present method is particularly suited for dark-field exposure where the majority of the imaging layer 14 is shielded from radiation to form raised features such as lines and pillars. After exposure, the imaging layer 22 is preferably subjected to a post-exposure bake ("PEB") at a temperature of from about 80° C. to about 150° C., more preferably from about 100° C. to about 130° C., for a time period of from about 30 seconds to about 60 seconds.

Upon exposure, the portions of the imaging layer 22 that are exposed to radiation are rendered insoluble in organic (non-alkaline) solvent developer. As shown in FIG. 3(B), the exposed imaging layer 22 is then contacted with solvent to remove the unexposed portions to form the desired pre-pattern 20' in the imaging layer 22. Alternatively, when using a positive-tone photoresist, the exposed portions of the imaging layer 22 can be rendered soluble in aqueous alkaline developer during the exposure process, in which case, the removal process is reversed from what is described above. That is, the exposed portions are removed during development to form the pattern (not shown). In either embodiment, at least about 95% of the unexposed (or exposed, as the case may be)

portions of the imaging layer 22 will preferably be removed by developer, more preferably at least about 99%, and even more preferably about 100% will be removed. Suitable non-alkaline solvent developers include n-butyl acetate, n-butyl propionate, isobutyl butyrate, and/or ketones (e.g., 2-heptanone). Suitable alkaline developers for positive-tone imaging layers are organic or inorganic alkaline solutions such as potassium hydroxide (KOH) and tetramethyl ammonium hydroxide (TMAH), and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Massachusetts), MF-320 (available from Shipley), and NMD3 (available from TOK, Japan).

Thus, pre-pattern formation results in portions of the hardmask layer 14 underneath imaging layer 22 being uncovered or exposed when those selected portions of the imaging layer 22 are removed from the stack 18'. FIG. 3(B) depicts the patterned stack 18'. The resulting pre-pattern 20' preferably comprises raised features 22' (e.g., lines, pillars, square islands, or combinations thereof) formed on the hardmask layer 14. These features 22' are chemically identical to the exposed portions of the imaging layer 22, and are each defined by respective sidewalls 22a and respective top surfaces 22b. It will be appreciated that in alternative embodiments, any other suitable patterning process may be used to pattern the imaging layer 22 and form raised features 22', including multiple patterning processes, as well as immersion lithography. As mentioned above, it will also be appreciated that a positive-tone resist or photosensitive material could also be used, instead of the negative-tone imaging layer 22 described herein. In that case, the unexposed portions of the imaging layer 22 remain insoluble, while the exposed portions are rendered soluble and are removed with developer. Other patterning methods may also be used, including emerging technologies, such as imprint lithography, nano-imprint lithography, hot embossing lithography, and stamping pattern transfer. These technologies use a patterned mold to transfer patterns instead of relying on photolithographic patterning, as described above.

Regardless of the embodiment, once the desired pre-pattern 20' is formed, a self-assembling composition 16 can be applied to the patterned stack 18', such that it flows into the spaces between the raised features 22' (directly adjacent the hardmask 14), and adjacent the sidewalls 22a of the raised features 22', as depicted in FIG. 3(C). In one or more embodiments, the self-assembling composition 16 can also overcoat the top surfaces 22b of the raised features 22'. However, in other embodiments, the self-assembling composition 16 preferably does not overcoat the top surfaces 22b of the raised features 22'. In other words, the self-assembling composition 16 is deposited between the raised features 22' and adjacent the feature sidewalls 22a, but is absent from the top surfaces 22h of the raised features 22'. As a result, the top surface 22b of the raised features 22' remain open to be easily removed via solvent removal or etching, without the need for an etch-back step or other modification of the self-assembling layer 16 to expose the pre-pattern 20'.

The self-assembling composition 16 can then be self-assembled or annealed as described above to yield first self-assembled regions 16a and second self-assembled regions 16b in the self-assembled or annealed layer 16', with one of the first or second self-assembled regions being adjacent the raised feature sidewalls 22a, and the other of the first or second self-assembled regions 16a, 16b segregated away from the raised features 22'. As depicted in FIG. 3(D), the first self-assembled regions 16a are segregated away from (i.e., not in contact with) the raised feature sidewalls 22a, while the second self-assembled regions 16b are adjacent the raised feature sidewalls 22b. For example, in the case of PS-b-PMMA block copolymer self-assembling material, the polystrene (16b) would align adjacent to the photoresist sidewalls 22b, while the PMMA blocks (16a) are drawn towards each other and are segregated between adjacent self-assembled regions of polystrene.

Either of the first or second self-assembled regions 16a, 16b can then be removed to generate a pattern 20. For example, with reference to FIGS. 3(E) and (F), the first self-assembled region 16a can then be removed to generate a pattern 20 in the self-assembled self-assembling layer 16' on the patterned stack 18', followed by transferring this pattern down into the hardmask 14' and carbon-rich intermediate layer 12'. It will be appreciated that instead of the first self-assembled region 16a, the second self-assembled region 16b could removed instead. Regardless, the resulting pattern 20 is then eventually transferred down into the substrate 10 (not shown).

Figure 4:
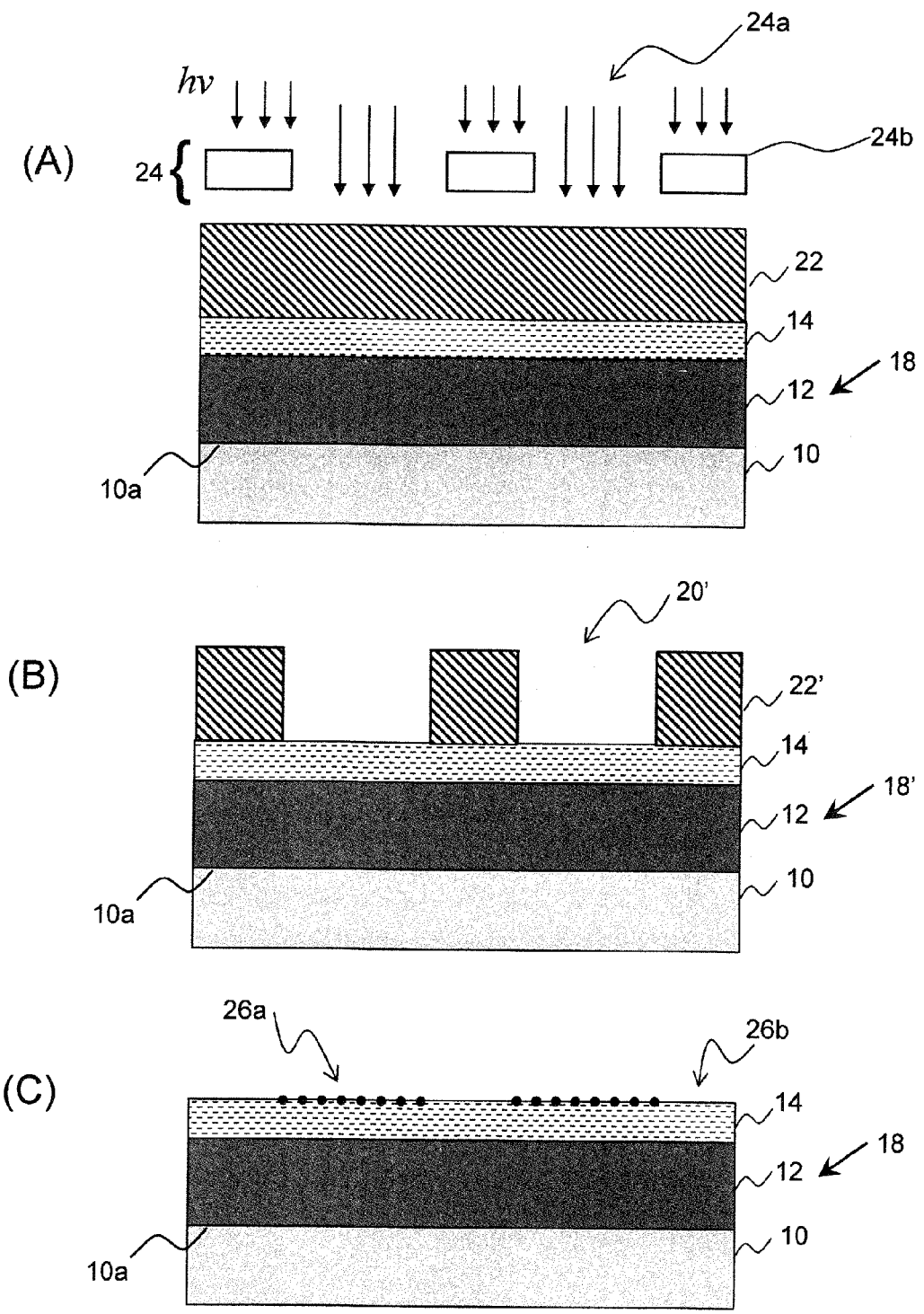
Figure 4:
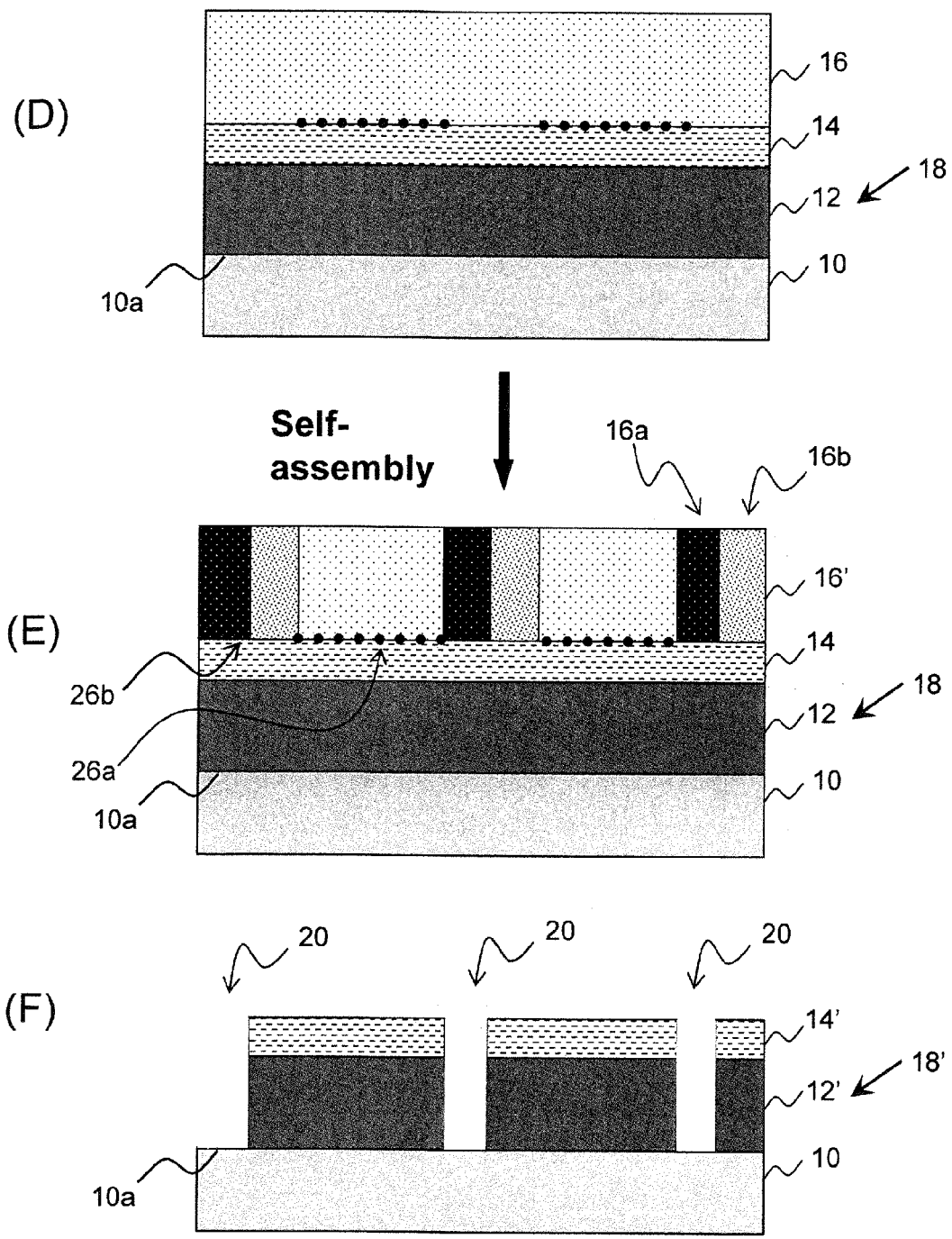

One advantage of the present invention is that the surface properties of the hardmask neutral layer can be modified from a neutral layer that will facilitate aligning of the self-assembling materials to a non-alignment layer over which the self-assembling materials will not align during annealing or self-assembly. With reference to FIG. 4, one embodiment of modifying the hardmask layer 14 for chemoepitaxy is depicted. A stack is prepared comprising a substrate 10, optional intermediate layer 12, hardmask neutral layer 14, and imaging layer 22, as described above. The imaging layer 22 is then patterned. The embodiment depicted in FIG. 4(A) illustrates optical lithography techniques for patterning the imaging layer 22, using a mask 24 having open areas 24a designed to permit radiation (hv) to pass through the mask 24 and contact the imaging layer 22 to yield exposed portions of the imaging layer 22 that are rendered soluble in developer (when using a positive-tone photoresist). The remaining solid portions 24b of the mask 24 are designed to prevent radiation from contacting the imaging layer 22 in certain areas to yield unexposed portions of the imaging layer that remain developer insoluble. Again, as explained above, those skilled in the art will readily understand that the arrangement of open areas 24a and solid portions 24b is designed based upon the desired pre-pattern to be formed in the imaging layer 22. After exposure, the imaging layer 22 is preferably subjected to a post-exposure bake ("PEB") at a temperature of from about 80° C. to about 150° C., more preferably from about 100° C. to about 130° C., for a time period of from about 30 seconds to about 60 seconds.

When a positive-tone photoresist is used, the exposed portions of the imaging layer 22' are then removed by alkaline developer contact, as illustrated in FIG. 4(B). Alternative methods of patterning the imaging layer 22 can be used, as described above, with the aim being to remove selected portions of the imaging layer 22 to create a pre-pattern 20'. Thus, pre-pattern formation results in portions of the hardmask layer 14 underneath imaging layer 22 being uncovered or exposed when those selected portions of the imaging layer 22 are removed from the stack 18'. The remaining portions of the imaging layer 22' adjacent the hardmask 14 serve as a mask for surface modification of the hardmask neutral layer 14. In one or more embodiments, the imaging layer 22 is patterned using optical lithography and alkaline developer rinse. Alternatively, the imaging layer is patterned using another suitable method, followed by contact with an alkaline developer solution. Regardless, the exposed portions of the hardmask layer 14 are contacted with an alkaline developer solution (separately or during developer rinse). As depicted in FIG. 4(C), the remaining portions of the imaging layer 22' are then removed (e.g., with solvent) yielding the hardmask layer 14 having surface-modified regions 26a and non-modified regions 26b, where the surface-modified regions 26a correspond to those portions of the hardmask 14 that were uncovered during patterning of the imaging layer 22. Advantageously, contact with the alkaline developer changes the surface energy of the hardmask layer 14. In one or more embodiments, the surface energy is increased and causes the surface-modified regions 26a of the hardmask 14 to lose their ability to act as a neutral layer and induce alignment during the self-assembly process. However, the non-modified regions 26b of the hardmask 14, which remained covered by the imaging layer 22 during patterning and developer contact still retain their neutral layer properties. Thus, the surface-modified regions 26a correspond to non-aligning areas while the non-modified regions 26b correspond to aligning areas on the hardmask 14. The active aligning areas 26b therefore have the ability to become guiding structures for pattern formation during self-assembly.

As illustrated in FIG. 4(D), a self-assembling layer 16 is then formed directly on top of the surface-modified hardmask layer 14, such that there is direct contact between the self-assembling layer 16 and surface-modified regions 26a and non-modified regions 26b. The self-assembling layer 16 is then self-assembled as described above to allow the components to self-assemble. Because of the surface modification, the self-assembling layer 16 will only self assemble into first self-assembled regions 16a and second self-assembled regions 16b in those portions of the layer 16 that are adjacent the non-modified areas 26b of the hardmask 14, as depicted in FIG. 4(E). In other words, portions of the self-assembling layer 16 adjacent the surface-modified areas 26b of the hardmask 14 do not separate or segregate into a pattern during annealing or self-assembly and are "unassembled" or "non-aligned." One of the first or second self-assembled regions 16a, 16b can then be selectively removed, followed by etching the resulting pattern 20 into the hardmask layer 14' and optional intermediate layer 12', as depicted in FIG. 4(F). This pattern 20 is eventually transferred down into the substrate 10 (not shown).

It will be appreciated that in each of the foregoing methods, self-assembly or annealing results in nanophase separation in the self-assembling layer 16, which permits the formation of nanometer-sized patterns generally not achievable using conventional optical lithography techniques. It will also be appreciated that although the present methods illustrate formation of at least two distinct annealed or self-assembled regions in the self-assembling layer 16, it is envisioned that additional DSA materials could be formulated which are capable of separation into more than two distinct phases, including third and fourth annealed or self-assembled regions.

Additional advantages of the various embodiments of the disclosure will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments, but is not necessarily included. Thus, the present invention encompasses a variety of combinations and/or integrations of the specific embodiments described herein.

In addition, while the drawings illustrate, and the specification describes, certain preferred embodiments, it is to be understood that such disclosure is by way of example only. Embodiments are described herein with reference to cross-section illustrations that are schematic illustrations of idealized embodiments of the present invention. As such, variations from the shapes of the illustrations as a result, for example, of manufacturing techniques and/or tolerances, are to be expected. There is no intent to limit the principles of the present embodiments to the particular disclosed embodiments. For example, in the drawings, the size and relative sizes of layers and regions may be exaggerated for clarity. In addition, embodiments should not be construed as limited to the particular shapes of regions illustrated herein but are to include deviations in shapes that result, for example, from manufacturing. For example, an etched region illustrated as a rectangle may have rounded or curved features. Thus, the regions illustrated in the figures are schematic in nature and their shapes are not necessarily intended to illustrate the precise shape of a region of a device, unless specifically indicated, and are not intended to limit the scope of the embodiments disclosed herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Synthesis of Polymer 1

In this Example, a silicon hardmask copolymer was synthesized by adding 8.01 grams of phenethyltrimethoxysilane (Gelest Inc, Morrisville, Pa.), 5.33 grams of 2-(carbomethoxy)ethyltrimethoxysilane (Gelest Inc.), and 60.11 grams of PGMEA (Ultra Pure Solutions, Inc., Castroville, Calif.) to a two-neck round-bottom flask. Over a 5-minute period, 5.50 grams of a 3N acetic acid solution (17.6% acetic acid in water, Aldrich, St Louis, Mo.) was added to the flask while the solution was being stirred. The round-bottom flask was fitted with a distillation head, distillation column, and collection flask. The solution was heated at 97.5° C. for 6.5 hours to complete the reaction and then allowed to cool down to room temperature. A total 64.8 grams of solution was collected and estimated solids content was 15.00%.

Example 2

Synthesis of Hardmask 1

A hardmask formulation was prepared by mixing 4.00 grams of Polymer 1 with 1.50 grams of a 0.4% solution in PGME of benzyltriethylammonium chloride (BTEAC, Aldrich), 18.40 grams of PGME, and 16.50 grams of PGMEA to make a 1.50% solids solution. The formulation was spin-coated onto a 4-inch silicon wafer at 1,500 rpm for 60 seconds followed by baking on a hotplate at 230° C. for 60 seconds. This process yielded a ~400 Å film.

Example 3

Synthesis of Polymer 2

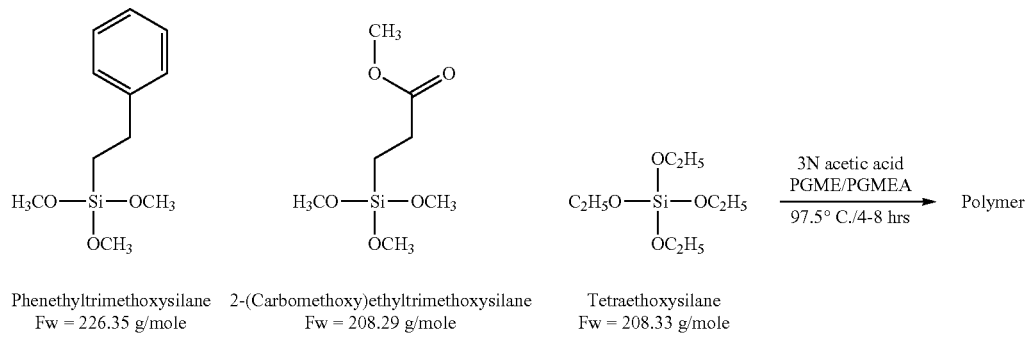

Phenethyltrimethoxysilane  2-(Carbomethoxy)ethyltrimethoxysilane  Tetraethoxysilane
Fw = 226.35 g/mole            Fw = 208.29 g/mole                   Fw = 208.33 g/mole In this Example, a silicon copolymer was synthesized by adding 8.00 grams of phenethyltrimethoxysilane, 5.45 grams of 2-(carbomethoxy)ethyltrimethoxysilane, and 3.19 grams of tetraethoxysilane (Gelest Inc.), to 60.70 grams of PGME in a two-neck round-bottom flask. Over a 5-minute period, 6.91 grams of a 3N acetic acid solution (17.6% acetic acid in water) were added to the flask while the solution was being stirred. The round-bottom flask was fitted with a distillation head, distillation column, and collection flask. The solution was heated at 97.5° C. for 6.0 hours to complete the reaction and then allowed to cool down to room temperature. A total 68.0 grams of solution was collected and estimated solids content was 15.78%.

Example 4

Synthesis of Hardmask 2

A hardmask formulation was prepared by mixing 4.00 grams of Polymer 2 with 1.58 grams of a 0.4% solution (in PGME) of BTEAC, 19.99 grams of PGME, and 16.96 grams of PGMEA to make a 1.50% solids solution. The formulation was spin-coated onto a 4-inch silicon wafer at 1,500 rpm for 60 seconds followed by baking on a hotplate 230° C. for 60 seconds.

Example 5

Directed Self-assembly on Hardmask 2

Figure 5:
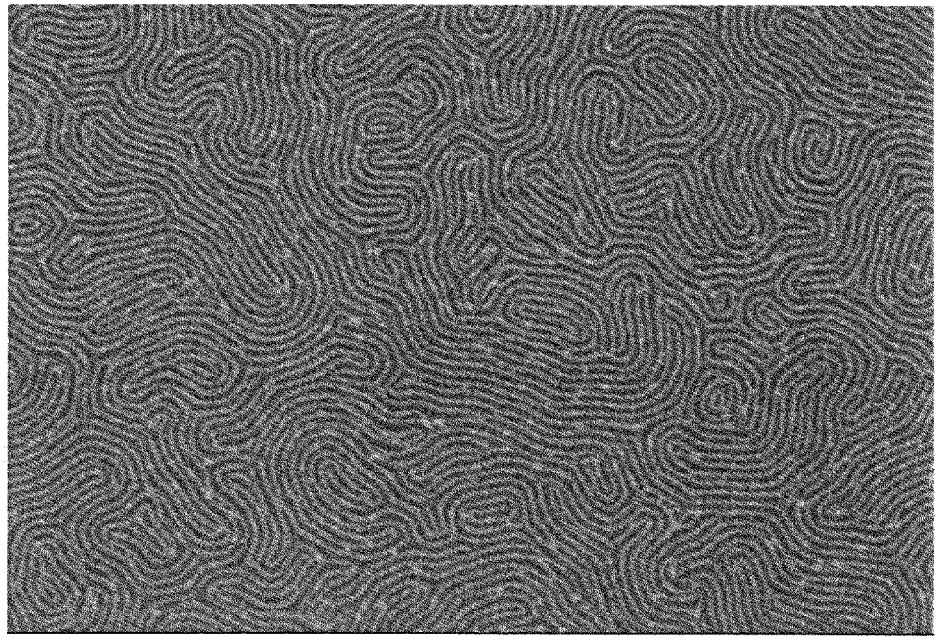
FIG. 5 is an SEM image of the DSA pattern formed in the PS-b-PMMA block copolymer (BCP) on Hardmask 2 from Example 5.

Hardmask 2 was spin-coated onto a 300-mm silicon wafer at a spin speed of 1,500 rpm for 60 seconds and baked on a hot plate at 230° C. to yield a film thickness of about 300 Å. A block copolymer composition (1% solution of PS-b-PMMA (25,000 Daltons molecular weight) in PGMEA; Polymer Source, Inc., Quebec, Canada) was spin-coated onto the hardmask layer 1,500 rpm for 60 seconds to yield a total thickness of about 725 Å for both the hardmask and the DSA layer. A thermal annealing was carried out at 230° C. for 5 minutes on a hot plate. The wafers were then subjected to an $O_2$ plasma etch at 20 W of power, 0.45 Torr of vacuum, and 5.25 sccm of gas flow for 5 seconds to produce high contrast on the SEM. FIG. 5 shows the pattern formed in the DSA layer on Hardmask 2.

Example 6

DSA on Hardmask 2 on Spin-On Carbon Layer

Figure 6:
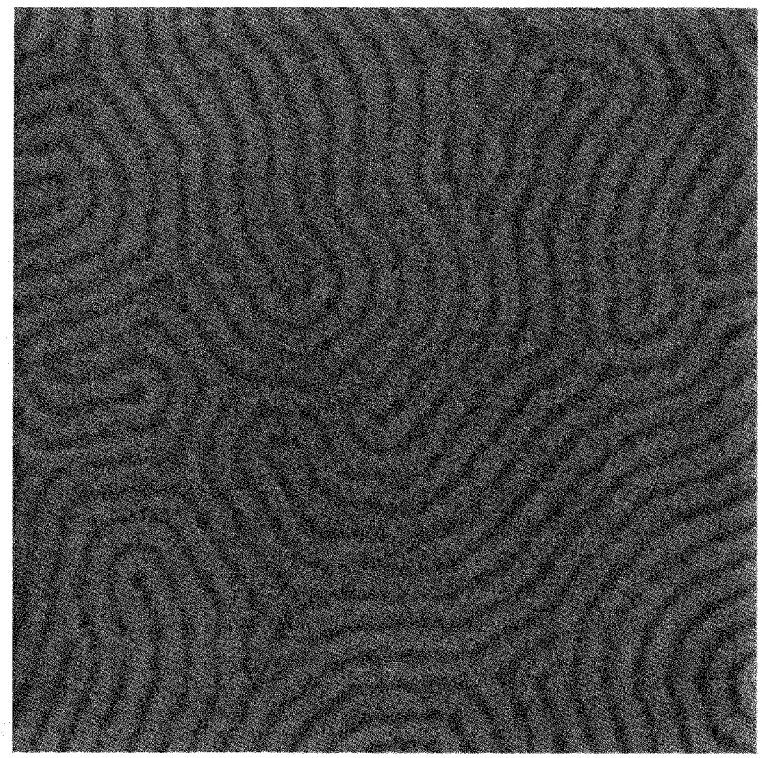
FIG. 6 is an SEM image (300,000× magnification) of the DSA pattern formed in the PS-b-PMMA BCP on Hardmask 2 on OptiStack® SOC110D-311 material from Example 6.
Figure 7:
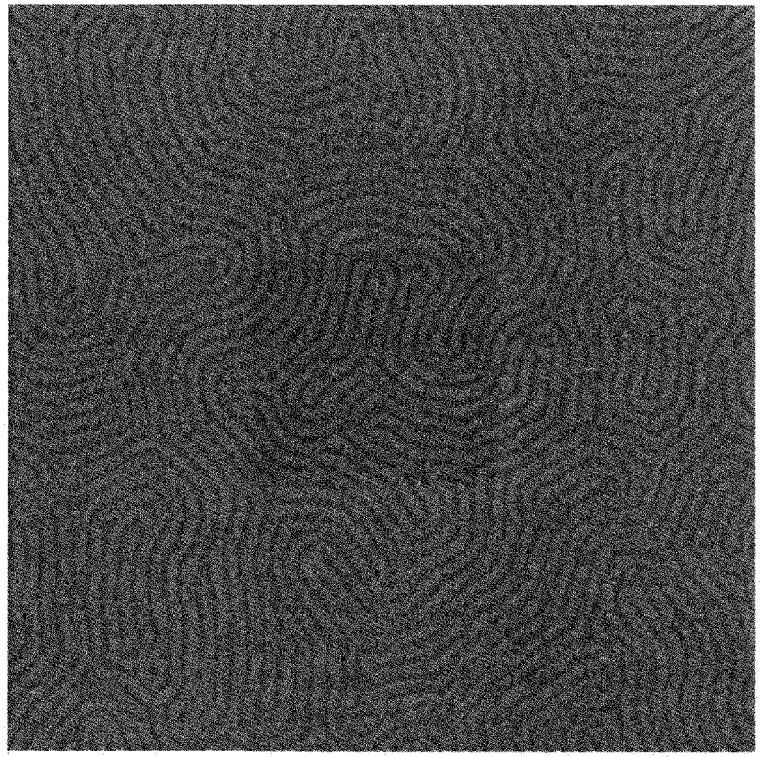
FIG. 7 is an SEM image (100,000× magnification) of the DSA pattern formed in the PS-b-PMMA BCP on Hardmask 2 on OptiStack® SOC110D-311 material from Example 6.

On a TEL CLEAN TRACK ACT 12TH track, a spin-on carbon (SOC; OptiStack® SOC 110D-311; Brewer Science, Rolla, Mo.) was spin-coated onto a 300-mm silicon wafer at a spin speed of 1,500 rpm for 30 seconds and then baked on a hot plate at 205° C. for 60 seconds to yield a film thickness of about 110 nm. Hardmask 2 was then coated on top of the SOC layer by spin-coating at 1,500 rpm for 30 seconds, followed by baking on a hot plate at 250° C. for 60 seconds to yield a film thickness of about 40 nm. The wafer was then coated with a PS-b-PMMA block copolymer (1% PS-b-PMMA in PGMEA solution, AZ Electronic Materials, Branchburg, N.J.) by spin-coating to give a target thickness of 31 nm. A thermal annealing was then carried out at 250° C. for 5 minutes on a hot plate under $N_2$ atmosphere. The wafers were inspected on a KLA eCD CD-SEM. FIGS. 6 and 7 show the pattern formed in the block copolymer DSA layer.

Example 7

Synthesis of Polymer 3

In this Example, a silicon copolymer was synthesized by adding 8.07 grams of phenethyltrimethoxysilane, 5.37 grams of 2-(carbomethoxy)ethyltrimethoxysilane, 8.51 grams of tetraethoxysilane, and 60.50 grams of PGME to a two-neck round-bottom flask. Over a 5-minute period, 9.21 grams of a 3N acetic acid solution (17.6% acetic acid in water) were added to the flask while stirring. The round-bottom flask was fitted with a distillation head, distillation column, and collection flask. The solution was heated at 97.5° C. for 5.0 hours to complete the reaction and then allowed to cool down to room temperature. A total 70.0 grams of solution was collected and estimated solids content was 17.51%.

Example 8

Synthesis of Hardmask 3

A hardmask formulation was prepared by mixing 4.00 grams of Polymer 3 with 1.75 grams of a 0.4% solution of BTEAC in PGME, 18.18 grams of PGME, and 23.23 grams of PGMEA to make a 1.50% solids solution. The formulation was spin-coated onto a 4-inch silicon wafer at 1,500 rpm for 60 seconds followed by baking on a hotplate 230° C. for 60 seconds. This process yielded a ~400 Å film.

Example 9

DSA on Hardmask 3 on SOC

Figure 8:
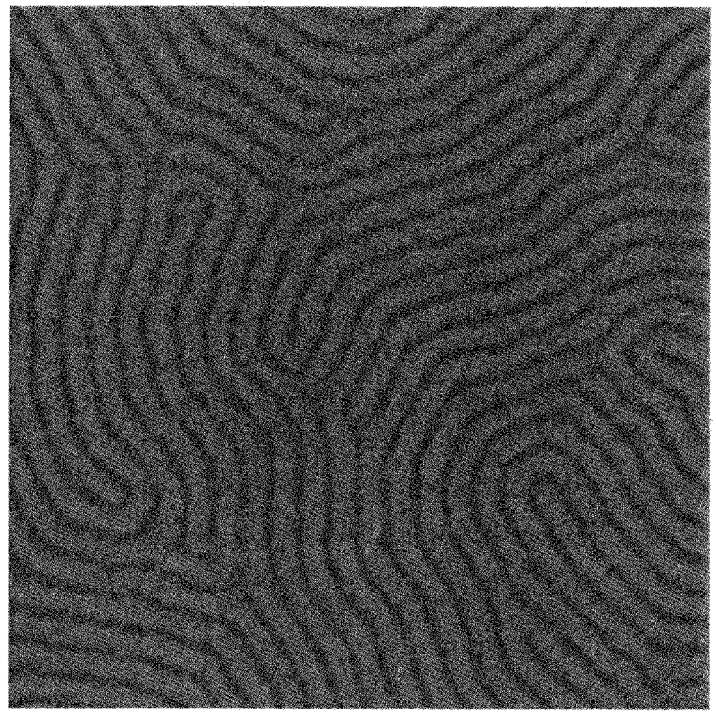
FIG. 8 is an SEM image (300,000× magnification) of the DSA pattern formed in the PS-b-PMMA BCP on Hardmask 3 on OptiStack® SOC110D-311 material from Example 9.
Figure 9:
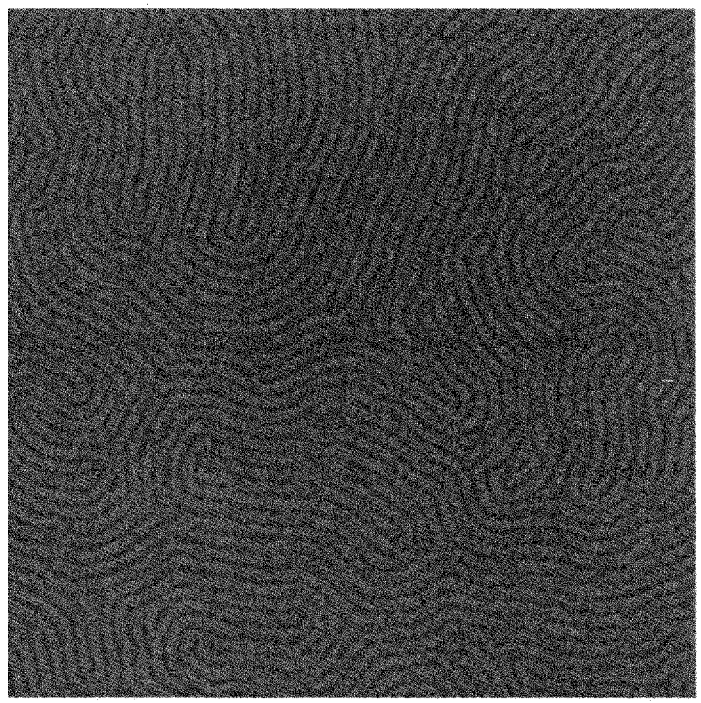
FIG. 9 is an SEM image (100,000× magnification) of the DSA pattern formed in the PS-b-PMMA BCP on Hardmask 3 on OptiStack® SOC110D-311 material from Example 9.
Figure 10:
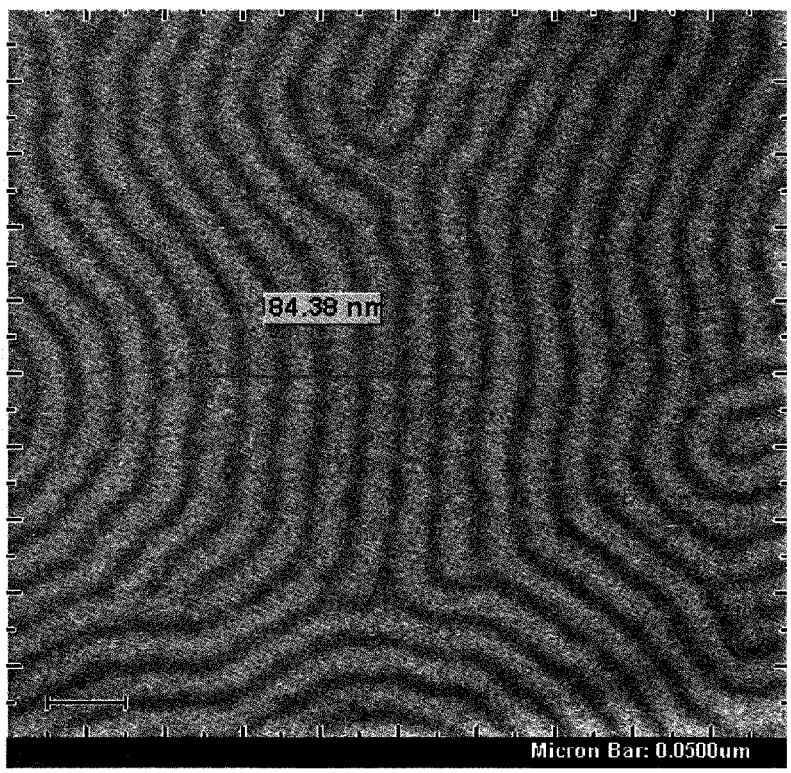
FIG. 10 is an SEM image (300,000× magnification) of the DSA pattern formed in the PS-b-PMMA BCP from Example 9 showing 13.2 nm/line spacing.

On a TEL CLEAN TRACK ACT12™ track, OptiStack® SOC110D-311 (Brewer Science) SOC was spin-coated onto a 300-mm silicon wafer at a spin speed of 1,500 rpm for 30 seconds, and then baked on a hot plate at 205° C. for 60 seconds to yield a film thickness of about 110 nm. Hardmask 3 was then coated on top of the SOC layer by spin-coating at 1,500 rpm for 30 seconds, followed by baking on a hot plate at 250° C. for 60 seconds to yield a film thickness of about 40 nm. The wafer was then coated with a PS-b-PMMA block copolymer (1% PS-b-PMMA in PGMEA solution, AZ Electronic Materials) by spin-coating to yield a target thickness of about 31 nm. Once the block copolymer was coated on the wafer, a thermal annealing at 250° C. for 5 minutes was performed on a hot plate under $N_2$ atmosphere. The wafers were then inspected on a KLA eCD CD-SEM. FIGS. 8 and 9 show the pattern formed in the DSA layer. FIG. 10 shows the DSA pattern formed in the block copolymer, showing 13.2 nm/line spacing.

Example 10

Solvent Testing and Effect of Surface Energy on Pattern Formation

In this Example, the hardmask neutral layer was subjected to various solvents commonly used in either positive-tone or negative-tone development. Surface energy measurements were obtained using contact angle measurements of $H_2O$ and methylene iodide (MI). The shape of static liquid droplets dispensed onto the surface of the hardmask neutral layer was measured using a goniometer. The slope of the tangent at the liquid-solid-vapor (LSV) interface and liquid drop shape were used to determine the contact angle and surface energy values. Three measurements per substrate were averaged for each contact angle test.

The hardmask neutral layer was coated onto a onto 110-nm spin-on carbon (SOC) substrate to a thickness of 30 nm and baked at 240° C. for 1 minute. Each solvent was then applied to the surface for 30 seconds (total dwell time). A spin-dry removal step followed by a bake of 150° C. for 30 seconds was performed on a standard Brewer Science® Cee® 100CB spin coater/bake plate tool. Contact angle measurements for surface energy calculations were repeated after post-solvent processing. We used both negative-tone (2-heptanone, n-butyl acetate) and positive-tone (TMAH) developers. For the positive tone-developer test, a 193-nm photoresist (JSR 1682J) was first applied to the hardmask neutral layer, followed by blanket exposure (17 $mJ/cm^2$), and developing for 60 seconds using a 2.38% TMAH solution.

The Table below shows the different contact angles (surface energy) of the hardmask layer surface after contact with different developers and solvents.

TABLE

Surface energy of hardmask neutral layer before and after exposure to developers and solvents

| Process | $H_2O$ Contact Angle (°) | Polar Energy (dyn/cm) | Total Energy (dyn/cm) |
|---|---|---|---|
| Hardmask neutral layer | 72.0 | 9.0 | 41.0 |
| After n-butyl acetate rinse | 71.6 | 8.7 | 41.4 |
| After 2-heptanone rinse | 71.3 | 8.8 | 41.6 |
| After resist coat + exposure + TMAH develop | 68.4 | 9.8 | 44.2 |

There was minimal change (1-1.5%) to the surface energy or contact angles with solvents used for development of negative-tone photoresists. However, we observed a change in the range of 5-7% in total surface energy in the test performed using the positive developer. The observed change using TMAH developer was significant as it resulted in a diminished ability of the hardmask neutral layer to direct self-assembly of the block copolymers and induce pattern formation. To understand this effect, we printed open squares using a positive tone resist and process on a wafer coated with the hardmask, as described below

Example 11

Chemoepitaxy Using Modified Hardmask Neutral Layer

A multi-layer stack was prepared on a TEL CLEAN TRACK ACT 12TH track by spin-coating OptiStack® SOC 110D-311 onto a 300-mm silicon wafer at a spin speed of 1,500 rpm for 30 seconds, followed by baking on a hot plate at 205° C. for 60 seconds to yield a film thickness of about 110 nm. Hardmask 2 was then coated on top of the SOC layer by spin-coating at 1,500 rpm for 30 seconds, and then baking on a hot plate at 250° C. for 60 seconds to yield a film thickness of about 40 nm. A positive-tone photoresist (PAR855; Sumitomo Chemicals, Japan) was applied to the hardmask at 2,100 rpm for 40 seconds and baked on a hot plate at 100° C. for 60 seconds. The coated wafer was exposed in an ASML1250 scanner using an 11×11 matrix at 50 $mJ/cm^2$. After exposure, the wafer was post-exposure baked at 105° C. for 60 seconds, chilled, and developed using TMAH OPD262 (Fuji Film Electronic Materials, Zwijndrecht, Belgium) for 60 seconds.

The exposed areas of the photoresist (11×11 squares) were uncovered down to the hardmask, while the non-exposed areas were still covered with photoresist. The wafer was then rinsed for 60 seconds while being spun at 400 rpm with a photoresist removal solvent (RER500 (EL/MEK solvent); Fuji Film Electronic Materials, Zwijndrecht, Belgium). The wafer was then baked for 45 seconds on a 100° C. hot plate to dry, leaving the wafer completely free of photoresist.

The wafer was then coated with a PS-b-PMMA block copolymer in PGMEA solution, (AZ Electronic Materials, Branchburg, N.J.) by spin-coating. Once the block copolymer was coated on the wafer, a thermal annealing was carried out at 250° C. for 5 minutes on a hot plate under $N_2$ atmosphere to yield a thickness of 31 nm. The wafers were inspected on a KLA eCD CD-SEM.

Figure 11:
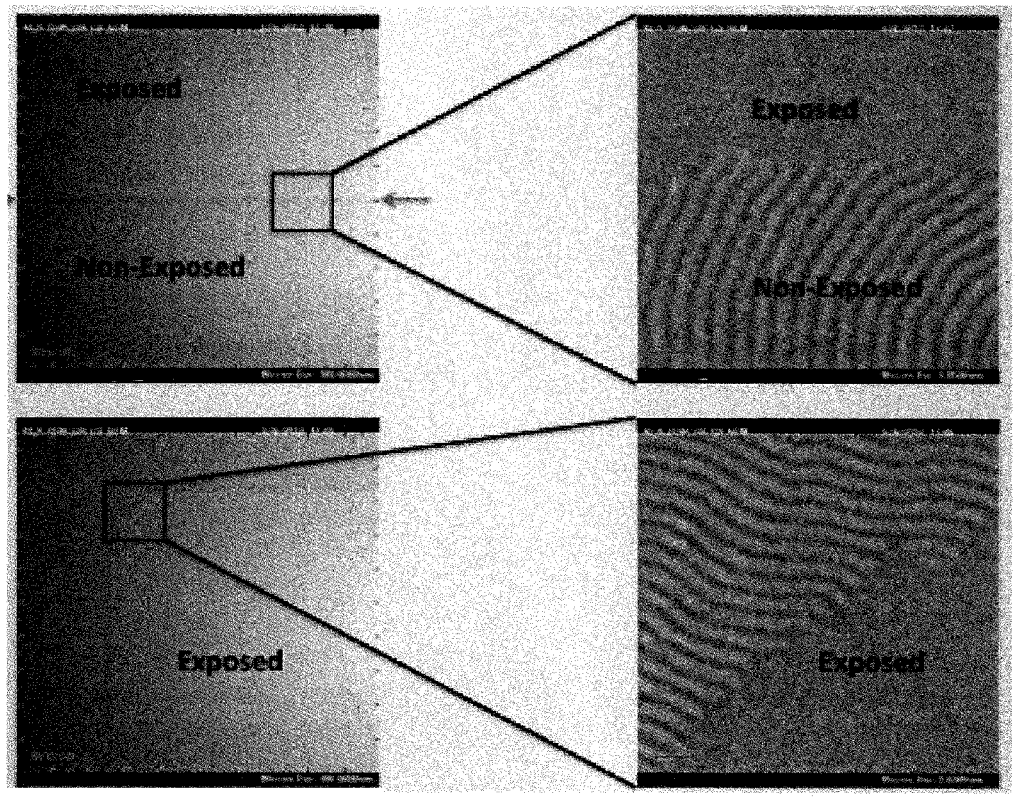
FIG. 11 shows SEM images showing alignment and non-alignment capabilities of the hardmask neutral layer after surface modification in Example 11.

FIG. 11 shows that in the portions of the hardmask exposed to developer (inside the squares), no patterning occurred. In other words, the block copolymer did not self-align. However, in the non-exposed areas (where the hardmask was not contacted with developer), the hardmask still acted as a neutral layer and was still capable of directing patterning of the block copolymer layer. The results show a clear delineation on the areas where the developer was in contact with the hardmask neutral layer. These areas no longer induced BCP alignment, while the areas that were covered with resist still show pattern formation. The ability of the hardmask neutral layer to change surface energy values is not necessarily a negative property of these materials but instead could be utilized for chemoepitaxy flows in the future.

Example 12

Synthesis of Polymer 4

In this Example, a silicon copolymer was synthesized by adding 10.00 grams of phenethyltrimethoxysilane, 4.30 grams of methyltrimethoxysilane, 10.52 grams of tetraethoxysilane, and 60.00 grams of PGME to a two-neck round-bottom flask. Over a 5-minute period, 11.36 grams of a 3N acetic acid solution (17.6% acetic acid in water) were added to the flask while stirring. The round-bottom flask was fitted with a distillation head, distillation column, and collection flask. The solution was heated at 97.5° C. for 5.0 hours to complete the reaction and then allowed to cold down to room temperature. A total 63.5 grams of solution were collected and estimated solids content was 19.08%.

Example 13

Synthesis of Hardmask 4

A hardmask formulation was prepared by mixing 3.50 grams of Polymer 4 with 1.67 grams of a 0.4% solution of BTEAC in PGME, 17.65 grams of PGME, and 22.17 grams of PGMEA to make a 1.50% solids solution. The formulation was spin-coated onto a 4-inch silicon wafer at 1,500 rpm for 60 seconds, followed by baking on a hotplate 230° C. for 60 seconds. This process yielded a ~400 Å film.

Figure 12:
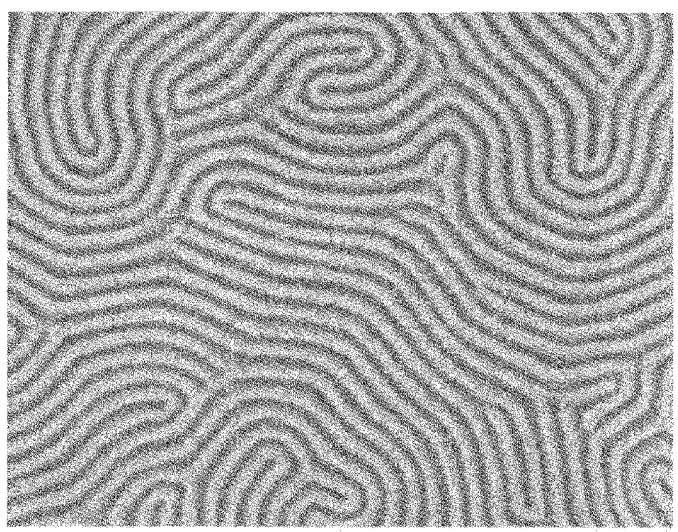
FIG. 12 is an SEM image (300,000× magnification) of the DSA pattern formed in the PS-b-PMMA BCP on Hardmask 4 on OptiStack® SOC110D-311 material from Example 13.

Hardmask 4 was also coated on top of a spin-on carbon layer (OptiStack® SOC 110D-311), followed by a PS-b-PMMA block copolymer DSA layer and thermal annealing, as described above. The resulting pattern formation is shown in FIG. 12.

Example 14

Synthesis of Polymer 5

In this Example, a silicon copolymer was prepared by adding 8.01 grams of phenyltrimethoxysilane, 4.30 grams of acetoxymethyltriethoxysilane, 6.92 grams of tetraethoxysilane, and 60.93 grams of PGME to a two-neck round-bottom flask. Over a 5-minute period, 9.66 grams of a 3N acetic acid solution (17.6% acetic acid in water) was added to the flask while stirring. The round-bottom flask was fitted with a distillation head, distillation column, and collection flask. The solution was heated at 97.5° C. for 5.0 hours to complete the reaction and then allowed to cold down to room temperature. A total 75.8 grams of solution were collected and estimated solids content was 15.43%.

Example 15

Synthesis of Hardmask 5

A hardmask formulation was prepared by mixing 4.00 grams of Polymer 5 with 1.54 grams of a 0.4% solution of BTEAC in PGME, 15.56 grams of PGME, and 20.47 grams of PGMEA to make a 1.50% solids solution. The formulation was spin-coated onto a 4-inch silicon wafer at 1,500 rpm for 60 seconds followed by baking on a hotplate 230° C. for 60 seconds. This process yielded a ~400 Å film.

Figure 13:
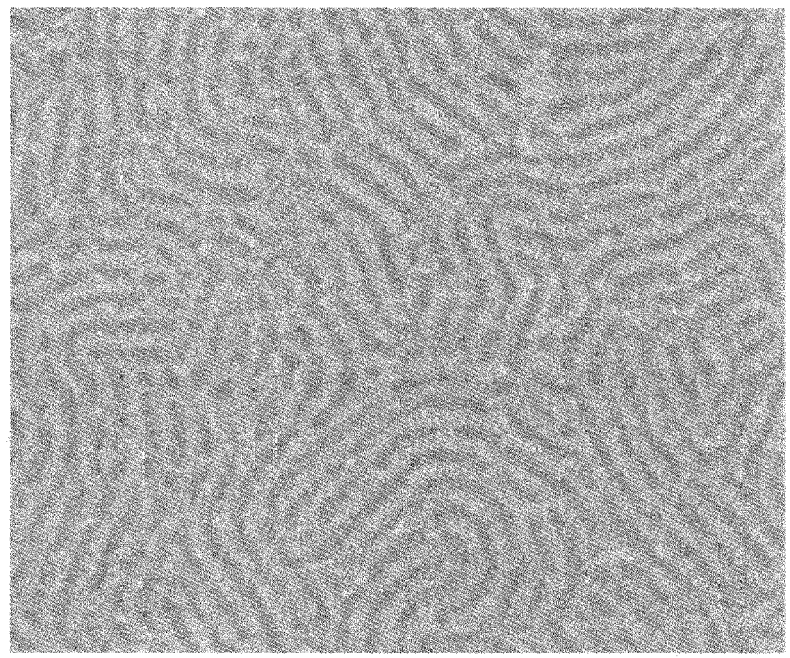
FIG. 13 is an SEM image (300,000× magnification) of the DSA pattern formed in the PS-b-PMMA BCP on. Hardmask 5 on OptiStack® SOC 110D-311 material from Example 15.

Hardmask 5 was also coated on top of a spin-on carbon layer (OptiStack® SOC110D-311), followed by a PS-b-PMMA block copolymer DSA layer and thermal annealing, as described above. The resulting pattern formation is shown in FIG. 13.

Example 16

Line/Space Pitch Multiplication

We utilized a graphoepitaxy process flow with negative-tone photoresist (from FUJIFILM Electronic Materials) to evaluate the hardmask neutral layer performance on its ability to form lines/spaces using pre-patterning. Using a TEL CLEAN TRACK ACT12™ under N, atmosphere, the hardmask neutral layer was coated on top of a 100-nm SOC layer, followed by the photoresist, which was patterned to 100-nm spaces and 600-nm pitch. A block copolymer DSA layer was then applied to the patterned photoresist, followed by thermal annealing. The block copolymer composition was prepared in-house by blending a commercially-available PS-b-PMMA block copolymer ($L_0$=25 nm; Polymer Source Inc.) with PGMEA in order to achieve 1% solids content solution.

Figure 14:
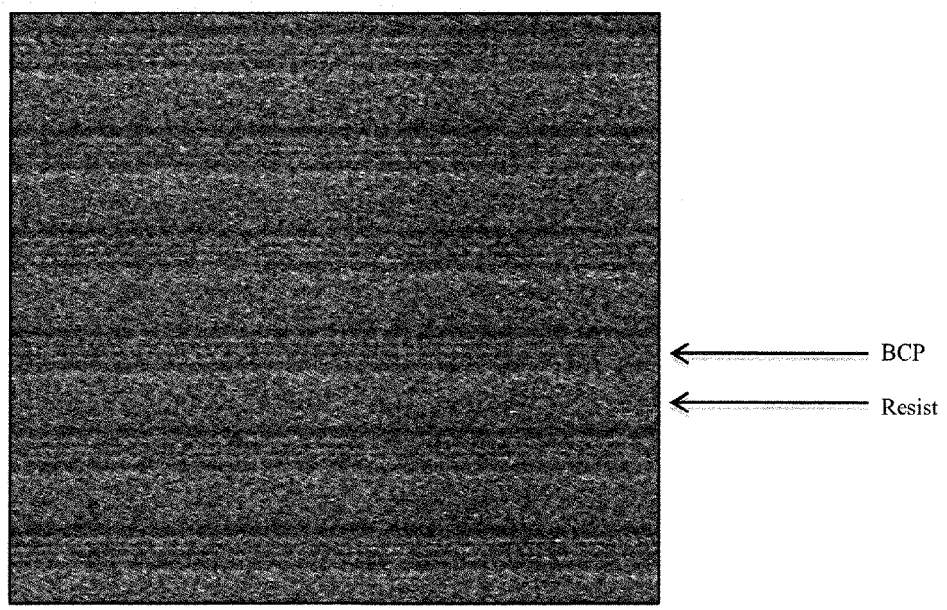
FIG. 14 is an SEM image (3× magnification) showing dense lamellae patterns formed after annealing the PS-b-PMMA BCP applied between the photoresist pre-pattern from Example 16.

All layers, with the exception of the resist, were baked at 240° C. for 1 minute (and for the block copolymer, for up to 5 minutes). The resist was hard baked at 200° C. for 5 minutes. Pre-patterns for lines/spaces were carried out on ASML XT 1250D scanner, at 0.85 NA using dipole illumination ($\sigma_o$=0.93, $\sigma_1$=0.69). CD SEM inspection (FIG. 14) shows formation of lines and spaces after between the pre-pattern after annealing, with a pitch of approximately 26 nm.

Example 17

Contact Hole Shrink

Contact hole shrinking was tested on patterned wafers having a target CD of 86 nm with a 130-nm pitch. Using a TEL CLEAN TRACK ACT12™ under $N_2$, a multi-layer stack was first formed using a hardmask neutral layer on top of a 100-nm SOC layer, followed by a negative-tone resist (SG-N003i resist; TOK, Tokyo, Japan), which was patterned before adding the block copolymer DSA layer. All layers, with the exception of the resist, were baked at 240° C. for 1 minute (for the block copolymer, for up to 5 minutes). The resist was hard baked at 200° C. for 5 minutes. The block copolymer composition was prepared using a commercially-available PS-b-PMMA block copolymer ($L_0$=25 nm: Polymer Source Inc.) blended with PGMEA in-house in order to achieve 1% solids content solution.

Figure 15:
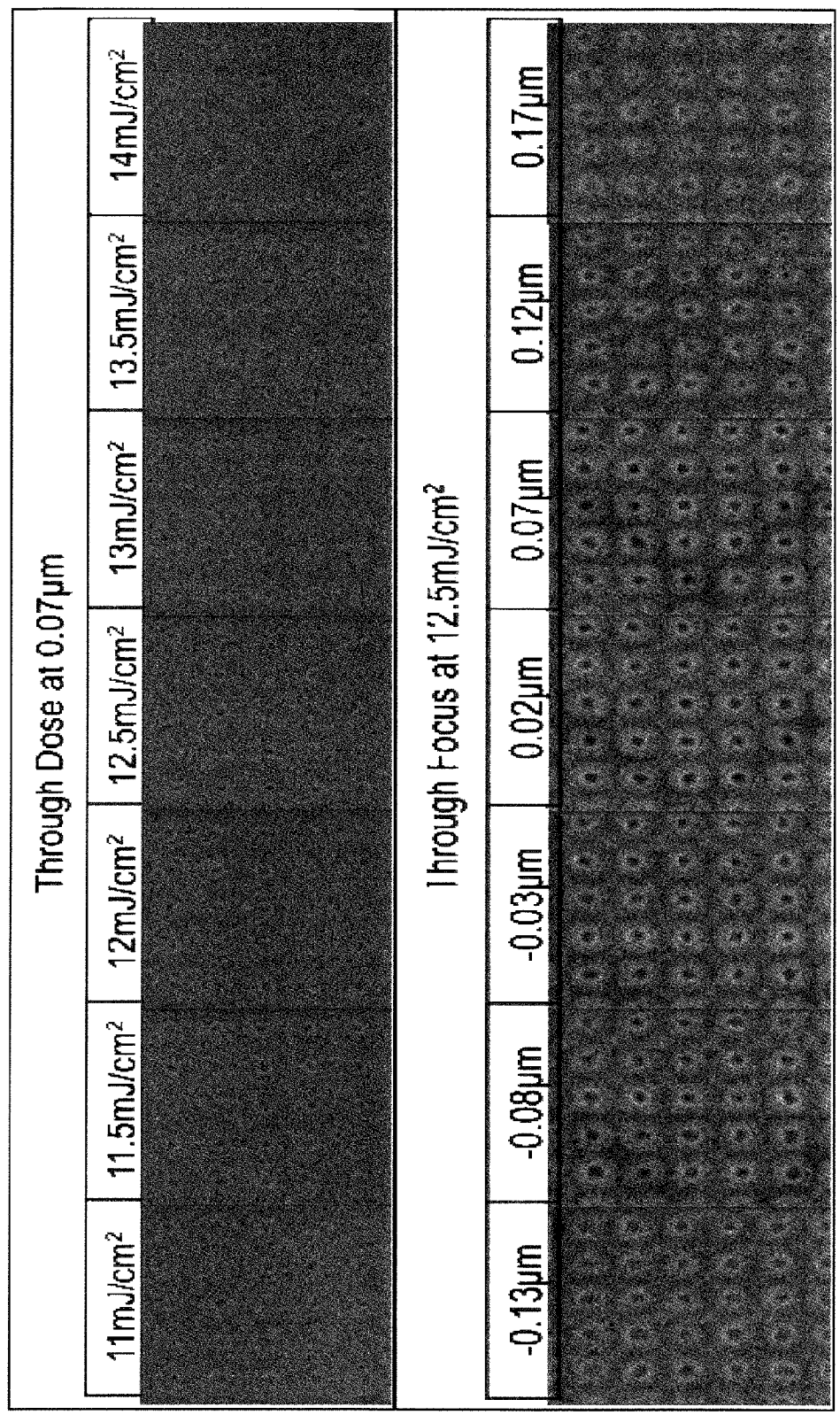
FIG. 15 shows SEM images demonstrating the performance through focus and dose of PS-b-PMMA BCP on coated lithography pre-patterns.

Contact hole pre-patterns were prepared in a Sokudo DUO track interfaced to a ASML NXT 1950i scanner, NA 1.30 using Quasar 30 illumination ($\sigma_o$=0.80, $\sigma_1$=0.65). FIG. 15 shows the performance through focus and dose of the block copolymer on the contact hole pre-patterns, after annealing. Good separation between the PMMA core and PS was observed through the focus and dose range.

Figure 16:
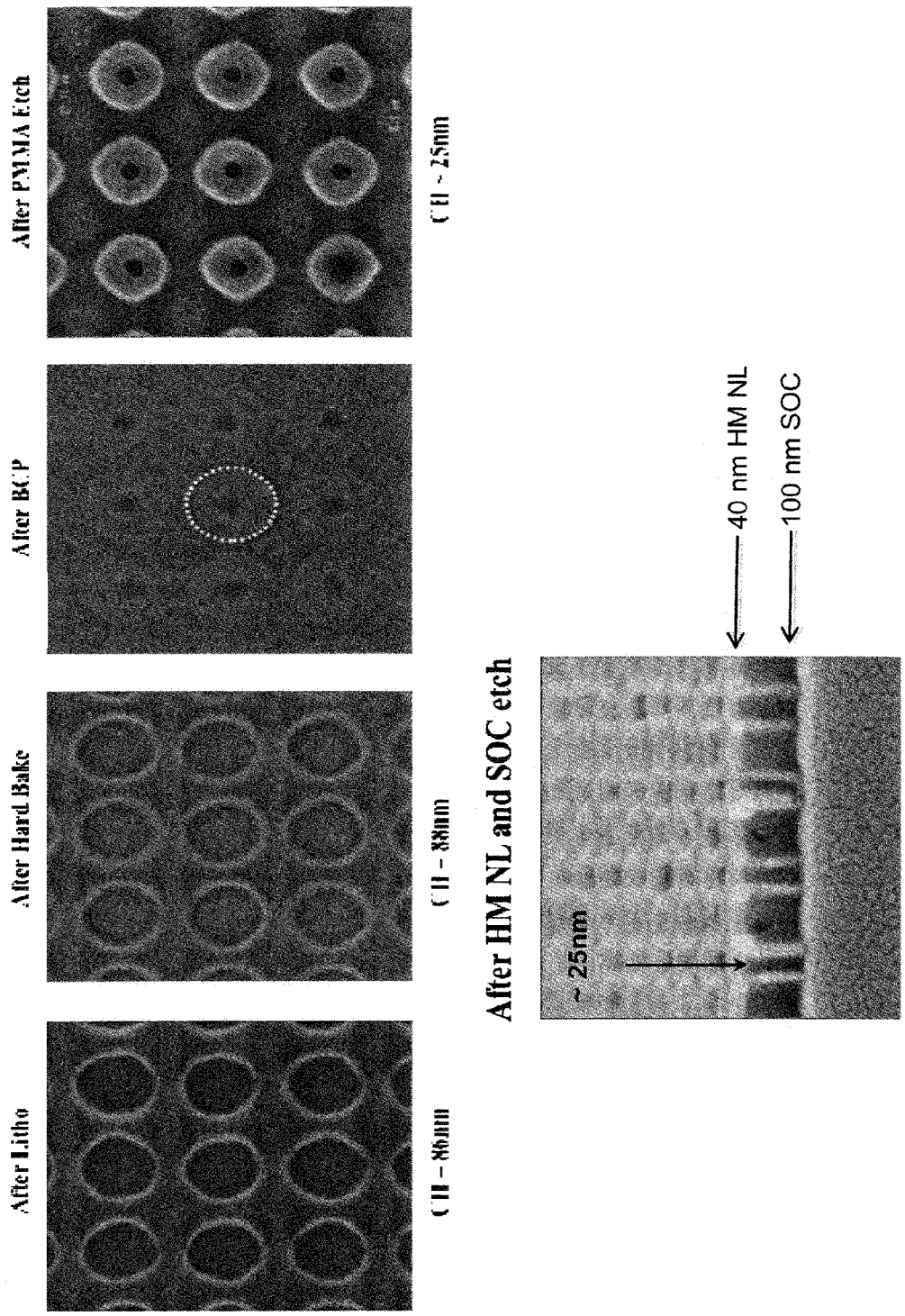
FIG. 16 shows SEM images demonstrating the contact hole shrink process carried out in Example 17.

The final step in DSA patterning is pattern transfer. The PMMA core is first etched to expose the HM NL. The open pattern must then be transferred to the HM NL, the SOC, and finally the underlying substrate. An Oxford PlasmaLab80+ etch tool was utilized for etch pattern transfer work. Bulk etch rates were calculated on blanket substrates to determine the etch rate followed by DOE work for power, pressure, and flow settings. PMMA removal was carried out in oxygen-rich plasma for a short time (<10 seconds), producing a contact hole opening of approximately 25 nm. Due to the poor etch bias between PS and PMMA, greater than 30% of PS thickness was lost. However, the HM NL provided etch benefits. Etch selectivity between the remaining PS and the HM NL was much greater, and low power (~200 watts), low pressure (10-15 mTorr) gas flows combining Ar:CF$_4$ (1:3) were used to successfully etch through the HM NL. Following the HM etch process, the 110-nm SOC material etch was accomplished using low power (~200 watts), medium pressure (30 mTorr) and N$_2$:Ar:O$_2$ gas ratios of 1:1:3. We were able to open 40 nm of HM NL, followed by 100 nm of SOC. The final CD was ~60 nm smaller than the initial 86-nm resist opening. FIG. 16 summarizes the overall process of contact hole shrinkage.

We claim:

1. A method of forming a microelectronic structure using directed self-assembly, said method comprising:
   providing a wafer stack, said stack comprising:
      a substrate having a surface; and
      one or more optional intermediate layers on said substrate surface;
   spin coating a composition to form a hardmask layer adjacent said intermediate layers if present, or on said substrate surface if no intermediate layers are present, further comprising a pre-pattern comprising a plurality of raised features on top of said hardmask layer, said raised features being spaced apart and each being defined by respective sidewalls and a top surface; and
   applying a self-assembling composition directly on top of said hardmask layer in spaces between said raised features,
   said self-assembling composition self-assembling into a self-assembled layer directly adjacent said hardmask layer, wherein said self-assembled layer comprises a first self-assembled region and a second self-assembled region different from said first self-assembled region.

2. The method of claim 1, further comprising removing one of said first self-assembled region or second self-assembled region to yield a pattern in said self-assembled layer.

3. The method of claim 2, further comprising transferring said pattern into said hardmask layer, said intermediate layer, if present, and into said substrate, wherein said pattern comprises a plurality of features selected from the group consisting of trenches, spaces, via holes, and contact holes having an average feature size of less than about 30 nm.

4. The method of claim 1, wherein said plurality of raised features are formed by:
   applying a photosensitive composition to form an imaging layer on said hardmask layer; and
   patterning said imaging layer to yield said pre-pattern, before applying said self-assembling composition to said hardmask layer.

5. The method of claim 4, wherein said patterning comprises:
   exposing said imaging layer to radiation to yield exposed and unexposed portions of said imaging layer; and
   contacting said imaging layer with an organic non-alkaline solvent so as to remove said unexposed portions.

6. The method of claim 1, wherein said hardmask layer comprises a surface having surface-modified regions and non-modified regions, said first and second self-assembled regions being adjacent said non-modified regions.

7. The method of claim 6, wherein, before applying said self-assembling composition to said hardmask layer, said surface-modified regions and non-modified are formed by:
   applying a photosensitive composition to form an imaging layer on said hardmask layer; and
   patterning said imaging layer to yield said pre-pattern, wherein said patterning comprises selectively removing portions of said imaging layer to uncover portions of said hardmask layer;
   contacting said uncovered portions of hardmask layer with an alkaline developer to yield said surface-modified regions; and
   removing remaining portions of said imaging layer from said hardmask layer to yield said non-modified regions.

8. The method of claim 1, wherein said hardmask layer is a crosslinked layer comprising siloxane crosslinkages.

9. The method of claim 1, wherein said hardmask layer is formed from a composition comprising a silicon-containing polymer dissolved or dispersed in a solvent system.

10. The method of claim 9, wherein said silicon-containing polymer is prepared by polymerization of silicon precursor materials selected from the group consisting of silanes, siloxanes, silsesquioxanes, and combinations thereof.

11. The method of claim 9, wherein said silicon-containing polymer further comprises light attenuating moieties selected from the group consisting of phenyl, naphthalene, anthracene, carbazole, and combinations thereof.

12. The method of claim 9, wherein said silicon-containing polymer comprises moieties compatible with said self-assembling composition.

13. The method of claim 1, wherein said self-assembling composition comprises a block copolymer dispersed or dissolved in a solvent system.

14. The method of claim 13, wherein said block copolymer comprises at least two distinct blocks each selected from the group consisting of polystyrene, poly(methyl methacrylate), poly(lactic acid), poly(ethylene oxide), polydimethylsiloxane, and polyvinylpyrrolidone.

15. The method of claim 13, further comprising heating said self-assembling composition to at least about the glass transition temperature of said block copolymer, wherein said self-assembling composition self-assembles during said heating.

16. The method of claim 1, wherein said self-assembling composition comprises a blend of immiscible polymers.

17. The method of claim 1, wherein said first self-assembled region has a first etch rate in wet or dry etchants, and said second self-assembled region has a second etch rate in wet or dry etchants, and wherein said first etch rate is different from said second etch rate.

18. The method of claim 1, wherein said hardmask layer is formed from a composition comprising a polymer dissolved or dispersed in a solvent system.

19. The method of claim 1, wherein said hardmask layer is formed from a composition comprising a silicon-containing polymer dispersed or dissolved in a solvent system, said polymer comprising recurring units of

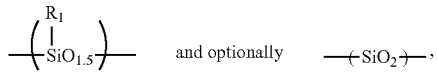

where each R$_1$ is individually selected from the group consisting of alkyls, chromophores, compatible moieties, and combinations thereof.

20. The method of claim 1, wherein said hardmask layer comprises from about 20% to about 45% by weight silicon, based upon the total weight of the layer taken as 100% by weight.

21. A method of forming a microelectronic structure using directed self-assembly, said method comprising:

providing a wafer stack, said stack comprising:
  a substrate having a surface; and
  one or more optional intermediate layers on said substrate surface; and
spin coating a composition to form a hardmask layer adjacent said intermediate layers if present, or on said substrate surface if no intermediate layers are present;
forming surface-modified regions and non-modified regions by:
  applying a photosensitive composition to form an imaging layer on said hardmask layer;
  patterning said imaging layer to yield said pre-pattern, wherein said patterning comprises selectively removing portions of said imaging layer to uncover portions of said hardmask layer;
  contacting said uncovered portions of hardmask layer with an alkaline developer to yield said surface-modified regions; and
  removing remaining portions of said imaging layer from said hardmask layer to yield said non-modified regions; and
applying a self-assembling composition directly on top of said hardmask layer, said self-assembling composition self-assembling into a self-assembled layer directly adjacent said hardmask layer, wherein said self-assembled layer comprises a first self-assembled region and a second self-assembled region different from said first self-assembled region, said first and second self-assembled regions being adjacent said non-modified regions.

22. A method of forming a microelectronic structure using directed self-assembly, said method comprising:
providing a wafer stack, said stack comprising:
  a substrate having a surface;
  one or more optional intermediate layers on said substrate surface; and
  spin coating a composition to form a hardmask layer adjacent said intermediate layers if present, or on said substrate surface if no intermediate layers are present wherein said hardmask is formed from a composition comprising a silicon-containing polymer dissolved or dispersed in a solvent system; and
applying a self-assembling composition directly on top of said hardmask layer,
said self-assembling composition self-assembling into a self-assembled layer directly adjacent said hardmask layer, wherein said self-assembled layer comprises a first self-assembled region and a second self-assembled region different from said first self-assembled region.

23. A method of forming a microelectronic structure using directed self-assembly, said method comprising:
providing a wafer stack, said stack comprising:
  a substrate having a surface;
  one or more optional intermediate layers on said substrate surface; and
  spin coating a composition to form a hardmask layer adjacent said intemiediate layers if present, or on said substrate surface if no intermediate layers are present, said hardmask layer comprising from about 20% to about 45% by weight silicon, based upon the total weight of the composition taken as 100% by weight; and
applying a self-assembling composition directly on top of said hardmask layer, said self-assembling composition self-assembling into a self-assembled layer directly adjacent said hardmask layer, wherein said self-assembled layer comprises a first self-assembled region and a second self-assembled region different from said first self-assembled region.

* * * * *